(12) United States Patent
Tanada

(10) Patent No.: US 7,750,345 B2
(45) Date of Patent: Jul. 6, 2010

(54) SEMICONDUCTOR DEVICE

(75) Inventor: Yoshifumi Tanada, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 161 days.

(21) Appl. No.: 12/055,082

(22) Filed: Mar. 25, 2008

(65) Prior Publication Data

US 2008/0283837 A1    Nov. 20, 2008

(30) Foreign Application Priority Data

May 18, 2007    (JP)    ............... 2007-133382

(51) Int. Cl.
*H01L 31/20* (2006.01)
*H01L 21/00* (2006.01)

(52) U.S. Cl. ........................... 257/59; 438/149

(58) Field of Classification Search .................. 257/59, 257/72, 314–317, E27.084–E27.097; 438/149–157
See application file for complete search history.

(56) References Cited

U.S. PATENT DOCUMENTS

| | | | |
|---|---|---|---|
| 5,206,749 A | 4/1993 | Zavracky et al. | |
| 5,256,562 A | 10/1993 | Vu et al. | |
| 5,258,325 A | 11/1993 | Spitzer et al. | |
| 5,317,236 A | 5/1994 | Zavracky et al. | |
| 5,376,561 A | 12/1994 | Vu et al. | |
| 5,475,514 A | 12/1995 | Salerno et al. | |
| 5,654,811 A | 8/1997 | Spitzer et al. | |
| 5,705,424 A | 1/1998 | Zavracky et al. | |
| 5,781,164 A | 7/1998 | Jacobsen et al. | |
| 6,043,800 A | 3/2000 | Spitzer et al. | |
| 6,140,980 A | 10/2000 | Spitzer et al. | |
| 6,372,609 B1 | 4/2002 | Aga et al. | |
| 6,472,684 B1 | 10/2002 | Yamazaki et al. | |
| 6,509,602 B2 * | 1/2003 | Yamazaki et al. | ........... 257/314 |
| 6,576,924 B1 | 6/2003 | Yamazaki et al. | |
| 6,709,901 B1 | 3/2004 | Yamazaki et al. | |
| 6,740,939 B2 * | 5/2004 | Sayama et al. | ............... 257/371 |
| 6,906,347 B2 * | 6/2005 | Yamazaki et al. | ............... 257/72 |

FOREIGN PATENT DOCUMENTS

| | | |
|---|---|---|
| EP | 1 045 448 | 10/2000 |
| JP | 11-163363 | 6/1999 |
| JP | 2000-124092 | 4/2000 |

\* cited by examiner

*Primary Examiner*—Calvin Lee
(74) *Attorney, Agent, or Firm*—Fish & Richardson P.C.

(57) ABSTRACT

An object is to provide a structure for forming a circuit for which high-speed operation and low-voltage operation are required and a circuit for which sufficient reliability is required at the time of high voltage application in a circuit group provided over one substrate in a semiconductor device, and a manufacturing method thereof. A semiconductor device is provided with a plurality of kinds of transistors which include single-crystal semiconductor layers with different thicknesses, which are separated from a single-crystal semiconductor substrate and bonded, over one substrate. The single-crystal semiconductor layer of a transistor for which high-speed operation is required is formed thinner than that of a transistor for which high resistance to a voltage is required, so that the thickness of the single-crystal semiconductor layer is made to be thin.

24 Claims, 17 Drawing Sheets 1201    1202

190   191   192   193

SEMICONDUCTOR DEVICE

BACKGROUND OF THE INVENTION

1. Field of the Invention

The present invention relates to a semiconductor device having a transistor over a substrate having an insulating surface and a method for manufacturing the semiconductor device.

2. Description of the Related Art

Integrated circuits have been developed, which use a semiconductor substrate called a silicon-on-insulator (hereinafter also referred to as an SOI) that has a thin single crystal semiconductor layer over an insulating surface, instead of a silicon wafer that is manufactured by thinly slicing an ingot of a single-crystal semiconductor. Integrated circuits each using an SOI substrate have been attracting attention as the ones in each of which parasitic capacitance between drains of the transistors and the substrate is reduced, improving performance of the semiconductor integrated circuit.

As a method for manufacturing SOI substrates, a hydrogen ion implantation separation method is known (for example, see Patent Document 1: Japanese Published Patent Application No. 2000-124092). The hydrogen ion implantation separation method is a method in which hydrogen ions are implanted into a silicon wafer to form a microbubble layer at a given depth from the surface, and a thin silicon layer (semiconductor layer) is attached and bonded to another silicon wafer with the microbubble layer used as a separation plane. In addition to the heat treatment for separation of a semiconductor layer, it is necessary to perform heat treatment in an oxidizing atmosphere to form an oxide film over the semiconductor layer, remove the oxide film thereafter, and perform heat treatment at from 1000 to 1300° C. in a reducing atmosphere to increase bonding strength.

On the other hand, a semiconductor device in which a single-crystal silicon layer is formed over an insulating substrate such as high heat resistant glass is disclosed (for example, see Patent Document 2: Japanese Published Patent Application No. H11-163363). The semiconductor device has a structure in which an entire surface of crystallized glass of which a strain point is higher than or equal to 750° C. is protected by an insulating silicon film and the single-crystal silicon layer obtained by hydrogen ion implantation separation method is firmly fixed over the insulating silicon film.

In the case of forming a transistor by using the semiconductor layer obtained by the above method as an active layer, there is an advantage that, for example, a latch-up phenomenon does not occur as compared to the case of forming a MOS transistor over a silicon wafer. Further, there is also an advantage that electrical characteristics of an obtained element are extremely excellent as compared to the case of forming a thin film transistor (TFT) by using a polycrystalline silicon layer, which is formed over an insulating substrate, as an active layer.

SUMMARY OF THE INVENTION

Meanwhile, in forming a transistor with the use of a silicon wafer or a thin semiconductor layer provided over an insulating substrate to form an integrated circuit, a characteristic required for a transistor may differ in accordance with the use of each circuit including a transistor, as the integrated circuit is increased in size and functionality. For example, there is a circuit for which high-speed operation and low voltage operation are required on the one hand and there is a circuit for which sufficient reliability is required at the time of high voltage application on the other hand. In order to form such a circuit group over one substrate, it is necessary to form a transistor having an optimal characteristic for each use; however, there is generally a tendency to create a trade-off between the kind of above-described characteristics and it is difficult to satisfy the both at the same time.

In the case of manufacturing a semiconductor device with the use of an SOI substrate, the cost has been high because a silicon wafer is used for a substrate to be a base, and further, there has been a limit to increase in size of the semiconductor device.

In view of the above problems, the present invention provides a structure for forming a circuit for which high-speed operation and low-voltage operation are required and a circuit for which sufficient reliability is required at the time of high voltage application, both of which exist in a circuit group provided over one substrate in a semiconductor device and a manufacturing method thereof.

In order to solve the above problems, such means as described below are taken in the present invention.

A semiconductor device is provided with a plurality of kinds of transistors which include single-crystal semiconductor layers with different thicknesses, which are separated from a single-crystal semiconductor substrate and bonded, over one substrate. The single-crystal semiconductor layer of a transistor for which high-speed operation is required is formed thinner than that of a transistor for which high resistance to a voltage is required, so that the thickness of the single-crystal semiconductor layer is made to be thin. Further, it is preferable for a gate insulating layer of a transistor for which high-speed operation is required to be also thinner than that of a transistor for which high resistance to a voltage is required.

For example, when a plurality of different silicon wafers are prepared and each of the silicon wafers is irradiated with hydrogen ions to form a separation plane, a target depth is controlled so that a plurality of semiconductor layers with different thicknesses are obtained and they are attached to one base substrate which is prepared separately. Each of the plurality of semiconductor layers with different thicknesses is selected in accordance with the use and the operating condition of a circuit to be formed later and utilized for, for example, forming a capacitor by being combined with an active layer, a resistor, an insulating film, or a conductive film of a transistor.

In the case where a thin gate insulating film is formed by, for example, surface self-oxidation of a thin semiconductor layer, the thin semiconductor layer is suitable for forming a transistor included in a circuit for which high-speed operation and low-voltage operation are mainly required; for forming a high resistance element; or for forming an effective capacitor if the thin gate insulating film is used as an insulating layer and further it is combined with a conductive film.

On the other hand, a thick semiconductor layer allows for formation of a thick gate insulating film by surface self-oxidation of the semiconductor layer or formation of a thick active layer and therefore is preferably used for forming, for example, a transistor included in a circuit for which operation reliability is required at the time of high voltage application.

Therefore, the semiconductor device of the present invention can have low power consumption and high reliability.

According to one aspect of the present invention, a semiconductor device has the following structure. The semiconductor device includes a first circuit group and a second circuit group which are provided over a base substrate having an insulating surface. The first circuit group includes a first transistor including a first single-crystal semiconductor layer and a first gate insulating layer. The second circuit group includes a second transistor including a second single-crystal semiconductor layer and a second gate insulating layer. The first single-crystal semiconductor layer and the second single-crystal semiconductor layer are provided with insulating layers interposed between the base substrate having an insulating surface and each of the first and second single-crystal semiconductor layers The first single-crystal semiconductor layer is thinner than the second single-crystal semiconductor layer.

In the above structure, the first circuit group can include a data driver, a logic circuit, or a read-only memory circuit of a display device. The second circuit group can include a scan driver, a pixel portion, a power supply circuit, or a memory circuit, which performs electrical writing/rewriting, of the display device.

According to another aspect of the present invention, a semiconductor device has the following structure. The semiconductor device includes a first circuit group, a second circuit group, and a third circuit group which are provided over a base substrate having an insulating surface. The first circuit group includes a first transistor including a first single-crystal semiconductor layer and a first gate insulating layer. The second circuit group includes a second transistor including a second single-crystal semiconductor layer and a second gate insulating layer. The third circuit group includes a third transistor including an amorphous semiconductor layer or a polycrystalline semiconductor layer and a third gate insulating layer The first single-crystal semiconductor layer and the second single-crystal semiconductor layer are provided with insulating layers interposed between the base substrate having an insulating surface and each of the first and second single-crystal semiconductor layers. The first single-crystal semiconductor layer is thinner than the second single-crystal semiconductor layer.

In the above structure, the first circuit group can include a data driver, a logic circuit, or a read-only memory circuit of a display device. The second circuit group can include a scan driver, a power supply circuit, or a memory circuit, which performs electrical writing/rewriting, of the display device. The third circuit group can include a pixel portion of the display device.

In the above structure, the first gate insulating layer is preferably thinner than the second gate insulating layer.

The thickness of the insulating layer having a bonding surface provided between the base substrate and the first single-crystal semiconductor layer may differ from that of the insulating layer having a bonding surface provided between the base substrate and the second single-crystal semiconductor layer. Thus, the thickness of the insulating layer having the bonding surface provided between the base substrate and the first single-crystal semiconductor layer may be thicker than that of the insulating layer having the bonding surface provided between the base substrate and the second single-crystal semiconductor layer. Further, insulating layers which become a base film are provided between the base substrate and each of the first and second semiconductor layers so that the thickness of the insulating layer provided between the base substrate and the first single-crystal semiconductor layer may be thicker than that of the insulating layer provided between the base substrate and the second single-crystal semiconductor layer.

It is to be noted that in the present invention, a semiconductor device refers to a device which can function by utilizing the semiconductor characteristics. With the use of the present invention, a device including a circuit which includes semiconductor elements (such as transistors, memory elements, or diodes) or a semiconductor device such as a chip including a processor circuit can be manufactured.

The present invention can also be applied to a semiconductor device (also referred to as a display device) that is a device having a display function. A semiconductor device using the present invention may be a semiconductor device in which a light-emitting element including a layer containing an organic material, an inorganic material, or a mixture of an organic material and an inorganic material which produces light emission called electroluminescence (hereinafter also referred to as EL) between electrodes is connected to a TFT (light-emitting display device); a semiconductor device using a liquid crystal element containing a liquid crystal material as a display element (liquid crystal display device), or the like. In the present invention, a semiconductor device having a display function corresponds to a device including a display element (a liquid crystal element, a light-emitting element, or the like). It is to be noted that a display device may be a main body of a display panel in which a plurality of pixels including display elements such as liquid crystal elements or EL elements and a peripheral driver circuits for driving the pixels are formed over a substrate. Further, a display device may be the one provided with a flexible printed circuit (FPC) or a printed wiring board (PWB) (an IC, a resistor, a capacitor, an inductor, a transistor, or the like). Moreover, a display device may include an optical sheet such as a polarizing plate or a retardation film. In addition, a backlight (such as a light guide plate, a prism sheet, a diffusion sheet, a reflection sheet, a light source (an LED, a cold-cathode tube, or the like)) may be included.

Note that various modes can be applied to a display element and a semiconductor device, and they can have various elements. For example, a display medium in which contrast is changed by an electromagnetic effect can be used, such as an EL element (for example, an organic EL element, an inorganic EL element, an EL element containing an organic material and an inorganic material), an electron discharging element, a liquid crystal element, an electron ink, a grating light valve (GLV), a plasma display (PDP), a digital micromirror device (DMD), a piezoelectric ceramic display, or a carbon nanotube. It is to be noted that a semiconductor device using an EL element may be an EL display; a semiconductor device using an electron discharging element may be a field emission display (FED), an SED type flat panel display (Surface-conduction Electron-emitter Display), or the like; a semiconductor device using a liquid crystal element may be a liquid crystal display, a transmissive liquid crystal display, a semi-transmissive liquid crystal display, or a reflective liquid crystal display, and a semiconductor device using an electron ink may be electronic paper.

The semiconductor device manufactured according to the present invention includes a first circuit group for which high-speed operation and low-voltage operation are required and a second circuit group for which reliability at the time of high voltage application is required, both of which are formed over one substrate. The thickness of an active layer of the transistor included in the first circuit group is thinner than that of an active layer of the transistor included in the second circuit group, or the thickness of a gate insulating film of the transistor included in the first circuit group is thinner than that of a gate insulating film of the transistor included in the second circuit group.

Miniaturization of an element of the transistor included in the first circuit group can be facilitated by reduction in thickness of the active layer or the gate insulating layer. Therefore, a load of a parasitic resistor, a parasitic capacitor, or the like can be reduced by reduction in area of a circuit or reduction in length of a wiring, and accordingly, high-speed operation and low-voltage operation become possible. Reduction in thickness of the active layer acts on a channel formation region to be completely depleted. Therefore, lower power consumption of the first circuit group is achieved.

On the other hand, high resistance to a high applied voltage and high reliability of the transistor included in the second circuit group can be ensured by increase in thickness of the active layer or the gate insulating film.

By the above method, a region in which high-speed operation and a low-voltage operation are performed and a region in which operation is performed at a high applied voltage can be formed over one substrate, which significantly contributes to formation of a function portion over one substrate, which was conventionally provided as an external IC or the like.

Further, by using a base substrate made of a light-transmitting material typified by glass, plastic, or the like, application to an inexpensive display device having a large area becomes possible.

As described above, the semiconductor device of the present invention can have low power consumption and high reliability.

DETAILED DESCRIPTION OF THE INVENTION

Figure 1A:
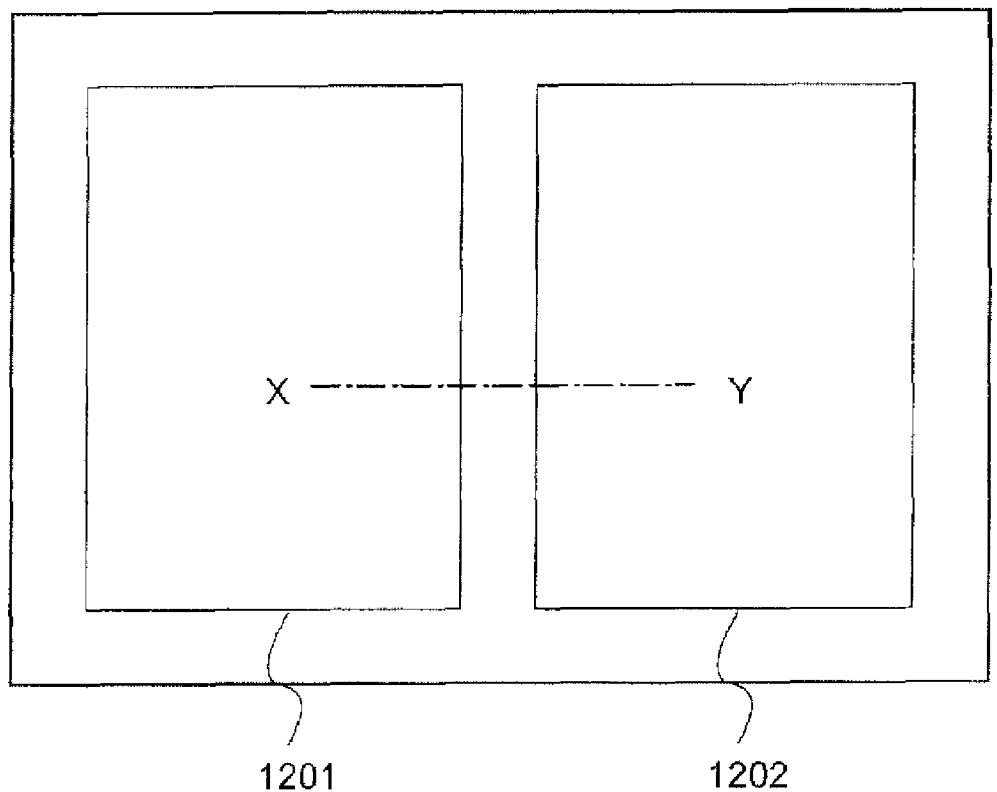
FIGS. 1A and 1B are diagrams showing a top structure and a cross-sectional structure of a semiconductor device of the present invention.

Hereinafter, embodiment modes of the present invention will be described with reference to the accompanying drawings. However, the present invention can be carried out in many different modes, and it will be easily understood by those skilled in the art that various changes and modifications can be made to the modes and their details without departing from the spirit and scope of the present invention. Therefore, the present invention should not be construed as being limited to the description in the following embodiment modes. Note that a common reference numeral refers to the same part or a part having a similar function throughout the drawings in the structure of the present invention described below, and the description thereof is omitted.

Embodiment Mode 1

A method for manufacturing a semiconductor device of the present invention is described with reference to FIGS. 1A to 6B, 9A to 9D, 14A, and 14B.

A method for providing a single-crystal semiconductor layer from a single-crystal semiconductor substrate, over a substrate having an insulating surface, is described with reference to FIGS. 9A to 9D and 10A to 10C.

Figure 9A:
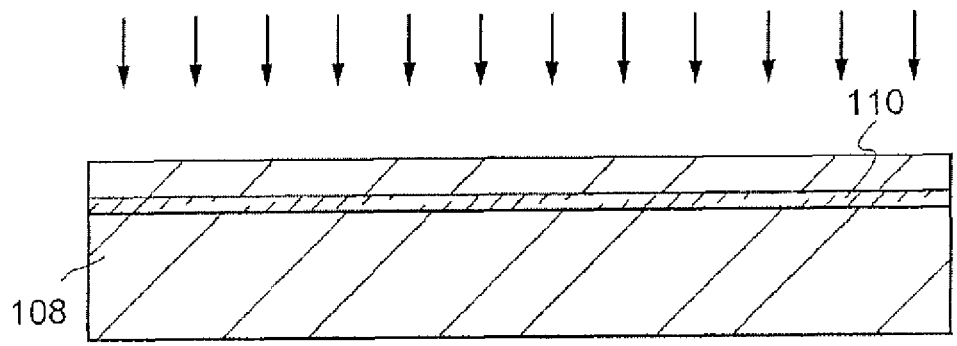
FIGS. 9A to 9D are diagrams illustrating manufacturing steps of a semiconductor device of the present invention.

A semiconductor substrate 108 shown in FIG. 9A is cleaned, and the semiconductor substrate 108 is irradiated with ions that are accelerated by an electric field to a given depth from the surface thereof to form a separation layer 110. The ion irradiation is carried out in consideration of the thickness of a single-crystal semiconductor layer that is to be transferred to a base substrate. A thickness of the single-crystal semiconductor layer is preferably from 1 to 3 μm. An accelerating voltage for irradiating the semiconductor substrate 108 with ions is set in consideration of such a thickness.

An n-type or p-type single-crystal silicon substrate (silicon wafer) is typically used as the semiconductor substrate 108. Alternatively, a substrate of silicon or germanium, or a substrate of a compound semiconductor such as gallium arsenide or indium phosphorus may be used. While an ion irradiation separation method in which a single-crystal semiconductor substrate is irradiated with ions of hydrogen or fluorine to a given depth and then heat treatment is performed to separate a surface layer part of a single-crystal silicon layer is applied in this embodiment mode, a method in which epitaxial growth of single-crystal silicon is performed over a porous silicon layer and then the porous silicon layer is separated by water jet may alternatively be applied.

The separation layer may be irradiated with ions by an ion-doping method or an ion implantation method. The separation layer is formed by being irradiated with ions of hydrogen, helium, or halogen typified by fluorine. In the case of irradiation with fluorine ions as halogen elements, $BF_3$ may be used as a source gas. Note that an ion implantation method refers to a method in which a semiconductor is irradiated with an ionized gas separated by mass.

In the case where the single-crystal silicon substrate is irradiated with halogen ions such as fluorine ions, added fluorine knocks out (expels) silicon atoms in a crystal lattice of silicon to effectively form a vacant portion, so that a minute void is formed in the separation layer. In this case, the volume of the minute void formed in the separation layer is changed by heat treatment at comparatively low temperature, and a thin single-crystal semiconductor layer can be formed by separation along the separation layer. After irradiation with fluorine ions, irradiation with hydrogen ions may be performed so that hydrogen is contained in the void. It is preferable to effectively utilize the action of halogen ions and hydrogen ions in such a manner because separation is performed along the separation layer which is formed to separate a thin semiconductor layer from a semiconductor substrate by utilization of a change in the volume of the minute void formed in the separation layer.

Alternatively, irradiation with ions of one kind or ions of a plurality of kinds which consist of the same atom and have different masses may be performed. For example, in the case of irradiation with hydrogen ions, the hydrogen ions preferably include $H^+$, $H_2^+$, and $H_3^+$ ions with a high proportion of $H_3^+$ ions. If the hydrogen ions include $H^+$, $H_2^+$, and $H_3^+$ ions with a high proportion of $H_3^+$ ions in the case of irradiation with hydrogen ions, the irradiation efficiency can be increased and irradiation time can be shortened. With such a structure, separation can be easily performed.

Because irradiation with ions should be performed at a high dose in the formation of the separation layer, there is a case where the surface of the semiconductor substrate 108 is roughened. Therefore, a protective film against ion irradiation, such as a silicon nitride film or a silicon nitride oxide film, with a thickness of from 50 nm to 200 nm, may be provided on a surface which is irradiated with ions.

Further, degreasing may be performed on the semiconductor substrate 108 and an oxide film on the surface may be removed to perform thermal oxidation. As thermal oxidation, general dry oxidation may be performed; however, oxidation in an oxidizing atmosphere in which halogen is added is preferably performed. For example, heat treatment is performed at a temperature of higher than or equal to 700° C. in an atmosphere containing HCl by from 0.5 to 10 volume % (preferably 3 volume %) with respect to oxygen. The heat oxidation is preferably performed at a temperature of from 950 to 1100° C. The processing time may be from 0.1 to 6 hours, preferably from 0.5 to 1 hour. The film thickness of an oxide film which is to be formed is 10 to 1000 nm (preferably, 50 to 200 nm), for example, 100 nm.

Instead of HCl, one or a plurality of kinds selected from $HF$, $NF_3$, $HBr$, $Cl_2$, $ClF_3$, $BCl_3$, $F_2$, $Br_2$, dichloroethylene, and the like can be applied as a compound containing halogen.

Heat treatment is performed within such a temperature range, so that a gettering effect by a halogen element can be obtained. Gettering particularly has an effect of removing a metal impurity. That is, an impurity such as metal turns into a volatile chloride, and then is diffused into a gas phase to be removed, by the action of chlorine. Heat treatment performed within such a temperature range is effective to the semiconductor substrate 108 of which surface is treated with chemical mechanical polishing (CMP). Further, hydrogen has an effect of compensating defects at an interface between the semiconductor substrate 108 and the oxide film which is to be formed so as to reduce a local level density of the interface, and the interface between the semiconductor substrate 108 and the oxide film is inactivated and thus electric characteristics are stabilized.

The oxide film formed by this heat treatment can contain halogen. The halogen element is contained at a concentration of from $1\times10^{17}$ to $5\times10^{20}/cm^3$, so that the oxide film can have a function as a protective film which captures an impurity such as metal and prevents contamination of the semiconductor substrate 108.

Figure 9B:
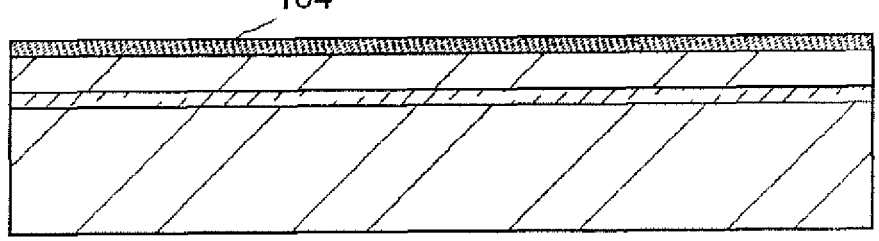

Next, as shown in FIG. 9B, a silicon oxide film is formed as an insulating layer having a bonding surface (bonding layer) 104 over a surface of the semiconductor substrate 108, which is to form a bond with a base substrate. The silicon oxide film is preferably formed by a chemical vapor deposition method using an organic silane gas. Alternatively, the silicon oxide film may be formed by a chemical vapor deposition method using a silane gas. Film formation by a chemical vapor deposition method is performed at a temperature of, for example, lower than or equal to 350° C., at which degassing of the separation layer 110 that is formed in the single-crystal semiconductor substrate does not occur. Heat treatment for separating a single-crystal semiconductor layer from a single-crystal or polycrystalline semiconductor substrate is performed at a higher temperature than the temperature at which the insulating layer 104 is formed.

The insulating layer 104 has a smooth surface and forms a hydrophilic surface. A silicon oxide film is suitable for the insulating layer 104. In particular, preferable is a silicon oxide film formed by a chemical vapor deposition method using an organic silane gas. As the organic silane gas, a compound containing silicon such as the following can be used: tetraethyl orthosilicate (TEOS) (chemical formula: $Si(OC_2H_5)_4$); trimethylsilane (TMS) (chemical formula: $(CH_5)_3SiH$), tetramethylsilane (chemical formula: $Si(CH_3)_4$), etramethylcyclotetrasiloxane (TMCTS); octamethylcyclotetrasiloxane (OMCTS); examethyldisilazane (HMDS); triethoxysilane (chemical formula: $SiH(OC_2H_5)_3$); or trisdimethylaminosilane (chemical formula: $SiH(N(CH_3)_2)_3$).

The insulating layer 104 which has a smooth surface and forms a hydrophilic surface is provided to a thickness of from 5 nm to 500 nm. With such a thickness, it is possible to smooth roughness of a surface on which a film is to be formed and also to ensure smoothness of a growing surface of the film. Further, distortion of the base substrate and the single-crystal semiconductor layer that are to be bonded together can be mitigated. The base substrate 101 may also similarly be provided with a silicon oxide film. In other words, in bonding the single-crystal semiconductor layer 102 to the base substrate 101, a strong bond can be formed when the insulating layer 104 formed of a silicon oxide film preferably using organic silane as a material is provided over one or both of surfaces that are to form a bond.

Figure 9C:
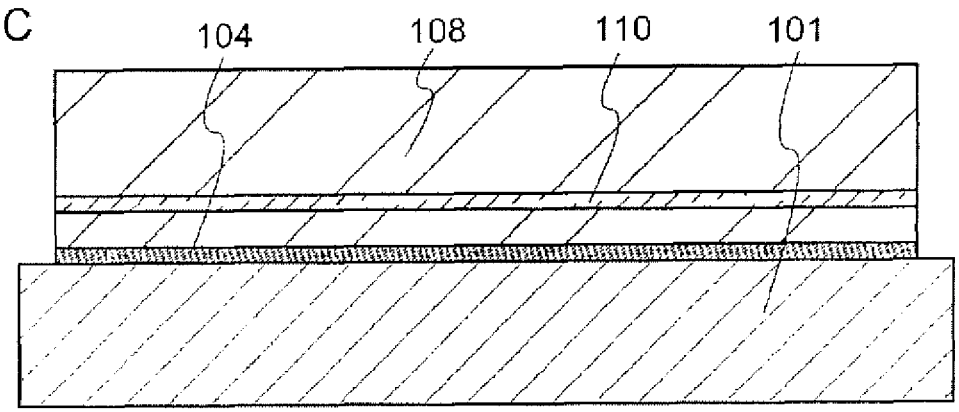

FIG. 9C shows a mode in which the base substrate 101 and a surface of the insulating layer 104, which is formed over the semiconductor substrate 108, are located so as to be in close contact with each other and bonded. The surface which is to form a bond is sufficiently cleaned. Then, when the base substrate 101 and the insulating layer 104 are made to face each other and one portion is pressed from external, the base substrate 101 and the insulating layer 104 attract each other by increase in strength of Van der Waals forces due to local reduction in distance between the bonding surfaces and contribution of a hydrogen bond. Further, the distance between the base substrate 101 and the insulating layer 104, which face each other, is reduced even in a neighboring region. Therefore, a region where Van der Waals forces act strongly and a region where a hydrogen bond involves expand, so that bonding is advanced and the bond is spread in the entire region of the bonding surface.

In order to form a favorable bond, the surface which is to form a bond may be activated. For example, the surface which is to form a bond is irradiated with an atomic beam or an ion beam. When an atomic beam or an ion beam is used, an inert gas neutral atom beam or inert gas ion beam of argon or the like can be used. Alternatively, plasma irradiation or radical treatment is performed. Such a surface treatment makes it possible to easily form a bond between different kinds of materials even at a temperature of from 200 to 400° C.

A step of separating the single-crystal semiconductor layer from the semiconductor substrate so as to be transferred to a glass substrate and a step of bonding the glass substrate and the single-crystal semiconductor layer strongly may be performed by separate heat treatments or may be simultaneously performed by one heat treatment.

After the base substrate 101 and the semiconductor substrate 108 are bonded to each other with the insulating layer 104 interposed therebetween, it is preferable that heat treatment or pressure treatment be performed. Heat treatment or pressure treatment makes it possible to increase bonding strength. The pressure treatment is performed so that pressure is applied perpendicularly to the bonding surface, in consideration of the pressure resistance of the base substrate 101 and the semiconductor substrate 108.

Figure 9D:
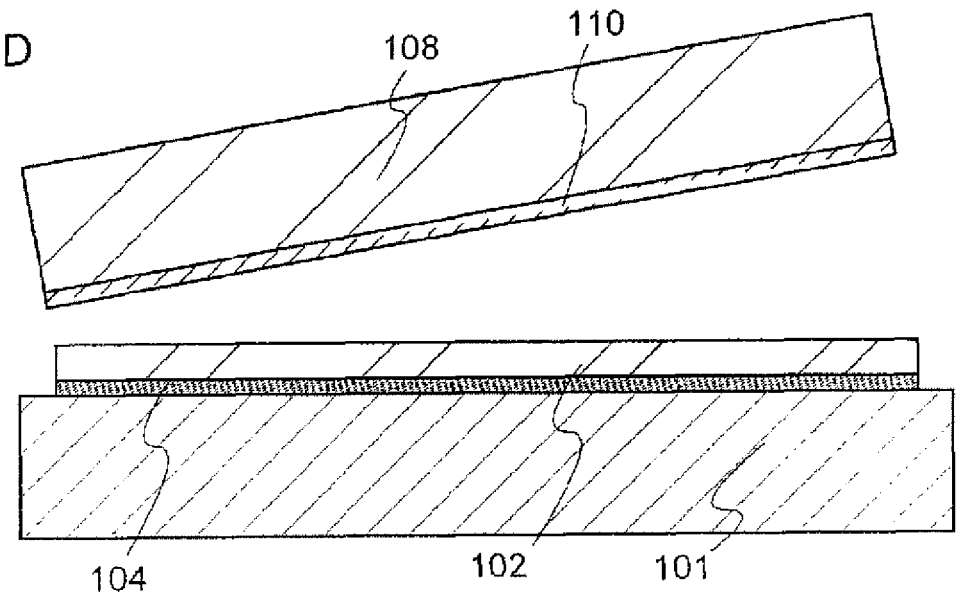

In FIG. 9D, after the base substrate 101 and the semiconductor substrate 108 are bonded together, heat treatment is performed to separate the semiconductor substrate 108 from the base substrate 101 with the separation layer 110 used as a separation plane. When the heat treatment is performed at, for example, from 400 to 600° C., a change occurs in the volume of minute voids formed in the separation layer 110, which enables separation to occur along the separation layer 110. In this embodiment mode, the heat treatment is performed at a temperature lower than that at which heat treatment is performed on the base substrate 101 in advance. Because the insulating layer 104 is bonded to the base substrate 101, the single-crystal semiconductor layer 102 having the same crystallinity as the semiconductor substrate 108 is left remaining over the base substrate 101.

Figure 10A:
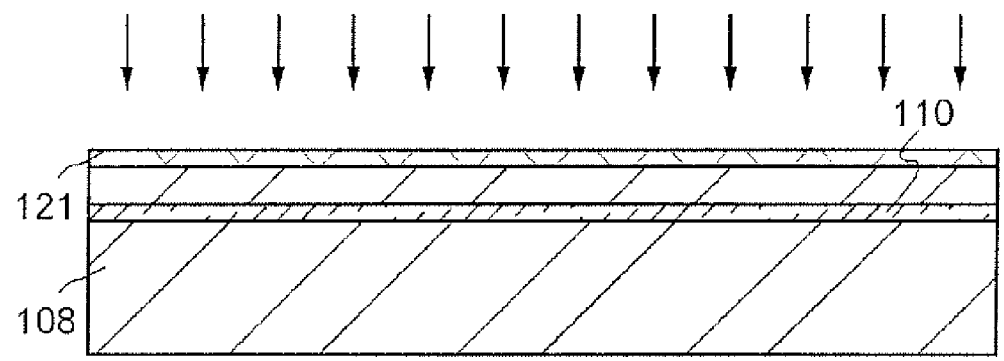
FIGS. 10A to 10C are diagrams illustrating manufacturing steps of a semiconductor device of the present invention.
Figure 10B:
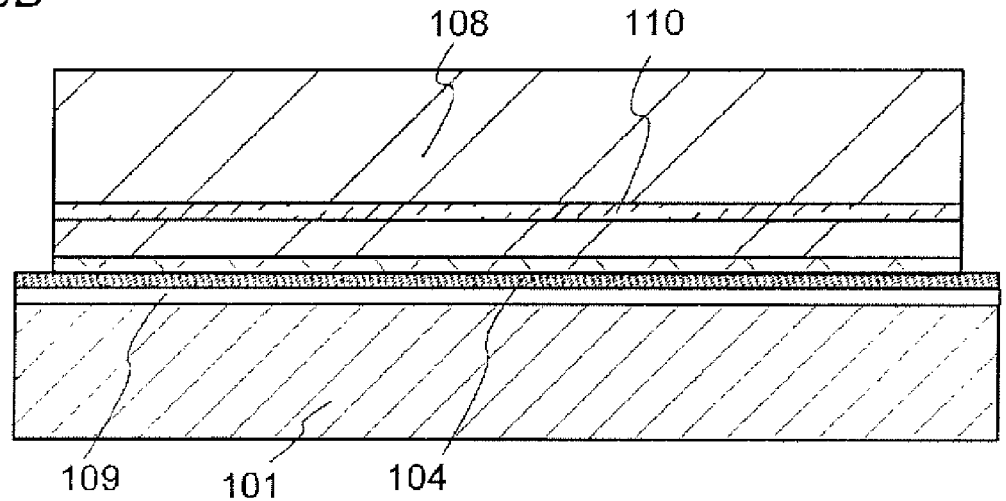
Figure 10C:
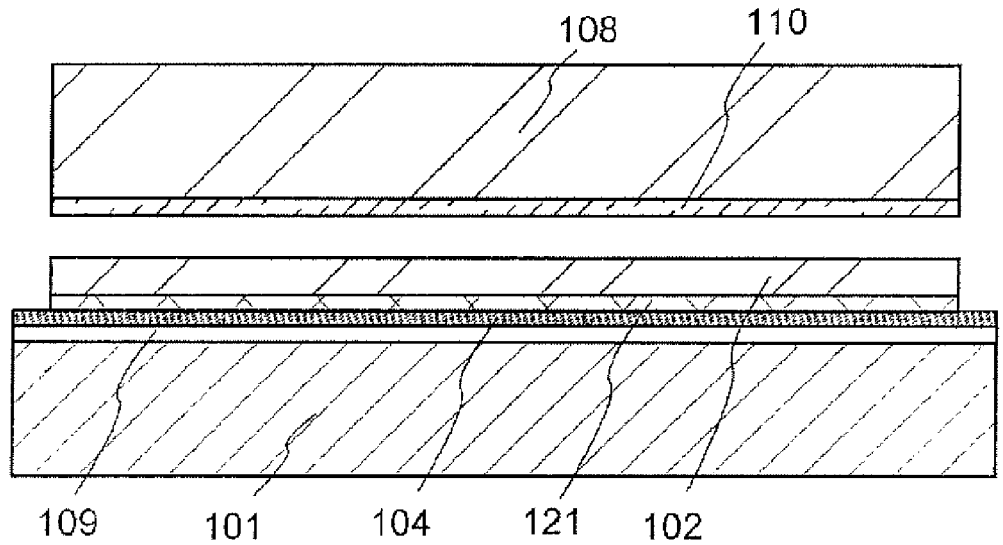

FIGS. 10A to 10C show steps of forming a single-crystal semiconductor layer with an insulating layer having a bonding surface provided on the base substrate 101 side. FIG. 10A shows a step in which the semiconductor substrate 108, which is provided with the silicon oxide film 121, is irradiated with ions that are accelerated by an electric field to a given depth to form the separation layer 110. The ion irradiation is similar to the case shown in FIG. 9A. By formation of the silicon oxide film 121 over the surface of the semiconductor substrate 108, the surface can be prevented from being damaged and from losing its planarity due to ion irradiation. Further, the silicon oxide film 121 has an effect of preventing diffusion of impurities against the single-crystal semiconductor layer 102 which is formed from the semiconductor substrate 108.

FIG. 10B shows a step in which the base substrate 101, over which the blocking layer 109 and the insulating layer 104 are formed, and a surface of the silicon oxide film 121, which is formed over the semiconductor substrate 108, are located so as to be in close contact with each other and bonded. When the insulating layer 104 and the silicon oxide film 121 are made to face each other and one portion is pressed from external, the insulating layer 104 and the silicon oxide film 121 attract each other by increase in strength of Van der Waals forces due to local reduction in distance between the bonding surfaces and contribution of a hydrogen bond. Further, the distance between the insulating layer 104 and the silicon oxide film 121, which face each other, is reduced even in a neighboring region. Therefore, a region where Van der Waals forces act strongly and a region where a hydrogen bond involves expand, so that bonding is advanced and the bond is spread in the entire region of the bonded surface.

After that, the semiconductor substrate 108 is separated as shown in FIG. 10C. Heat treatment for separating the single-crystal semiconductor layer is performed similarly to the case shown in FIG. 9D. The heat treatment in a bonding-separating process is performed at a temperature lower than or equal to that at which heat treatment is performed on the base substrate 101 in advance. Thus, the semiconductor substrate shown in FIG. 10C can be obtained.

As the base substrate 101, it is possible to use any of a variety of glass substrates that are used in the electronics industry and that are referred to as non-alkali glass substrates, such as an aluminosilicate glass substrate, an aluminoborosilicate glass substrate, and a barium borosilicate glass substrate. Alternatively, a quartz glass substrate may be used.

That is, a single-crystal semiconductor layer can be formed over a substrate that is longer than one meter on each side. With the use of such a large substrate, not only a display device such as a liquid crystal display but also a semiconductor integrated circuit can be manufactured.

Figure 3A:
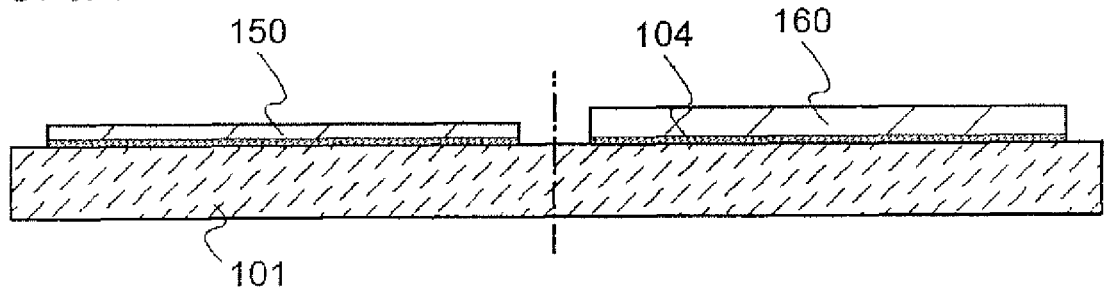
FIGS. 3A to 3D are diagrams illustrating manufacturing steps of a semiconductor device of the present invention.

The above steps are performed on a plurality of the semiconductor substrates 108 in each of which the separation layer 110 is formed at a different desired depth by controlling a depth to which ion irradiation is performed, and as shown in FIG. 3A, single-crystal semiconductor layers 150 and 160 having different thicknesses are formed over the base substrate 101. Although the single-crystal semiconductor layers having two kinds of thicknesses are shown here, single-crystal semiconductor layers having three or more kinds of thicknesses may be formed. The single-crystal semiconductor layers 150 and 160 are provided over the base substrate 101 with the insulating layer 104 interposed therebetween. Note that although the blocking layer 109 is omitted in FIGS. 3A to 3D, the blocking layer 109 may be provided over the base substrate 101.

Next, a process of forming a transistor with the use of the obtained single-crystal semiconductor layers 150 and 160 over the base substrate 101 to form a circuit is described.

Figure 3B:
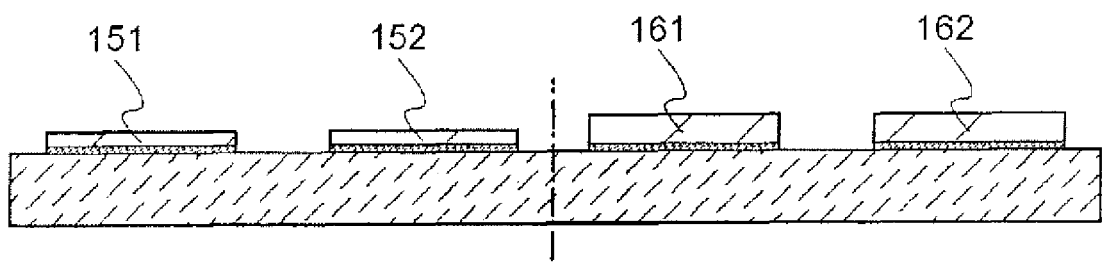

After the single-crystal semiconductor layers 150 and 160 having different thicknesses are obtained over the base substrate 101 with the insulating layer 104 interposed therebetween, according to the above process, a resist pattern is formed to have a desired shape with the use of a photomask, and island-shaped semiconductor layers 151, 152, 161, and 162 are obtained by processing using a photolithography method as shown in FIG. 3B. In following drawings, the silicon oxide film 121, the blocking layer 109, and the insulating layer 104 are omitted.

Thickness of the semiconductor layers 151 and 152 are made smaller than that of the semiconductor layers 161 and 162, so as to be, for example, from 5 to 30 nm, more preferably, from 10 to 20 nm. On the other hand, thickness of the semiconductor layers 161 and 162 is, for example, from 25 to 100 nm, more preferably, from 50 to 60 nm.

The above thicknesses are assumed as preferable thicknesses of the semiconductor layers in the case where the semiconductor layers are used as active layers of the transistor. Therefore, if gate insulating films are formed by surface self-oxidation of the semiconductor layers 151, 152, 161, and 162 in subsequent steps, the thicknesses of the semiconductor layers may be changed by the thicknesses of the gate insulating films as appropriate.

Reduction in thicknesses of the semiconductor layers makes it possible to suppress the short-channel effect of the transistor. Further, the threshold voltage of the transistor can be reduced, which enables low-voltage driving of a circuit.

The end portions of the semiconductor layers 151, 152, 161, and 162 are each formed to have a tilt angle (taper angle). The angle is preferably approximately from 45 to 95 degrees. In the case where this taper angle is low, in order to avoid influence by formation in a taper region of a parasitic transistor whose characteristics are different from those of a center portion of each of the semiconductor layers 151, 152, 161, and 162, it is preferable that the taper angle be approximately a right angle.

Note that in this specification, "end portion" of the semiconductor layer indicates an edge portion of the semiconductor layer formed to have an island shape. "Side surface" of the semiconductor layer indicates the surface of the edge portion.

Concerning an etching process, either plasma etching (dry etching) or wet etching may be employed. In the case of processing a large substrate, plasma etching is suitable. As an etching gas, a fluorine-based gas such as $CF_4$ or $NF_3$ or a chlorine-based gas such as $Cl_2$ or $BCl_3$ is used, and an inert gas such as He or Ar may be added to the etching gas as appropriate. When an etching process using an atmospheric discharge is employed, local discharge process is also possible, and it is not necessary to form the mask over the entire surface of the substrate.

In the present invention, a conductive layer for forming a wiring layer or an electrode layer, a mask for forming a predetermined pattern, or the like may be formed by a method by which a pattern can be selectively formed, such as a droplet discharging method. By a droplet discharging (jetting) method (also called an ink-jet method depending on its system), a droplet of a composition which is mixed for a particular purpose is selectively discharged (jetted) to form a predetermined pattern (such as a conductive layer or an insulating layer). At that time, treatment to control wettability or adhesion may be performed on a formation region. Alternatively, a method by which a pattern can be transferred or drawn, for example, a printing method (a method for forming a pattern, such as screen printing or offset printing), or the like may be used.

A mask used in this embodiment mode is formed using a resin material such as an epoxy resin, an acrylic resin, a phenol resin, a novolac resin, a melamine resin, or a urethane resin. Alternatively, an organic material such as benzocyclobutene, parylene, fluorinated arylene ether, or polyimide, a compound material made by polymerization of a siloxane-based polymer or the like; or the like may be used. Still alternatively, a commercial resist material containing a photosensitizer may be used. For example, a positive resist or a negative resist may be used. In a case of using a droplet discharging method, even when using any of the above materials, a surface tension and a viscosity are controlled as appropriate by, for example, adjusting the concentration of a solvent or adding a surfactant or the like.

Insulating layers 170a to 170h in contact with side surfaces of the semiconductor layers 151, 152, 161, and 162 may be formed. By forming the insulating layers 170a to 170h which are in contact with the side surfaces of the semiconductor layers 151, 152, 161, and 162, coverage with the insulating films at end portions of the semiconductor layers 151, 152, 161, and 162 can be improved. Therefore, short circuit between the semiconductor layers 151, 152, 161, and 162 and a conductive film, generation of leakage current, electrostatic breakdown, and the like, can be prevented.

After formation of the semiconductor layers 151, 152, 161, and 162, the insulating layers 170a to 170h can be formed in a self-aligning manner by stacking a silicon oxide film or a silicon nitride film and conducting anisotropic etching.

Alternatively, the insulating layers 170a to 170h can be formed by subjecting the end portions of the semiconductor layers 151, 152, 161, and 162 to oxidation treatment so as to be insulated selectively. The oxidation treatment can be performed by plasma treatment in an atmosphere containing oxygen. Alternatively, surfaces may be subjected to oxidation treatment using an aqueous solution (also referred to as wet oxidation). Halogen such as fluorine or chlorine may be introduced into the end portions of the semiconductor layers before plasma treatment, and then plasma treatment may be performed. When halogen is introduced, oxidation speed is high and oxidation proceeds preferentially. Therefore, thick insulating layers can be formed in the end portions of the semiconductor layers.

Figure 3C:
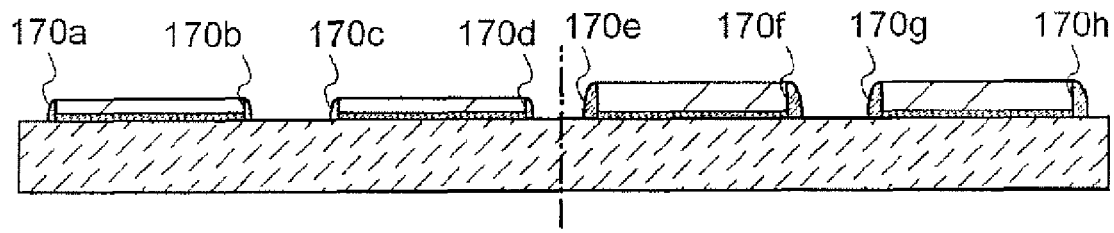
Figure 3D:
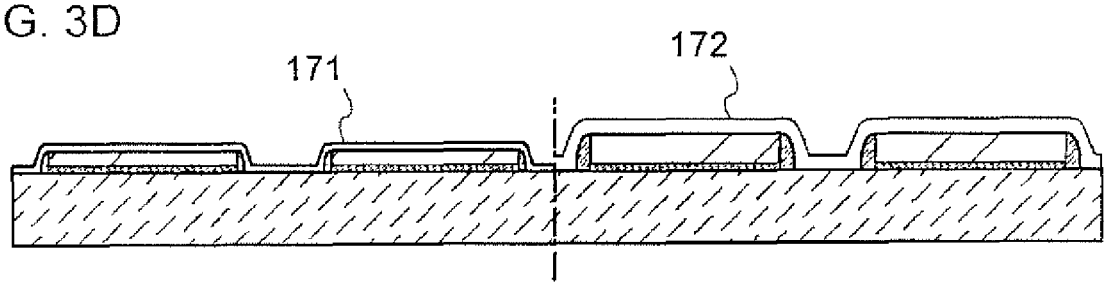
Figure 4A:
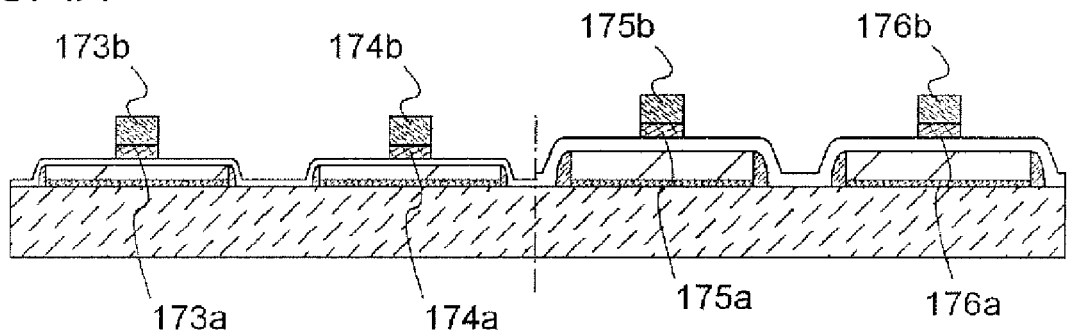
FIGS. 4A to 4D are diagrams illustrating manufacturing steps of a semiconductor device of the present invention.
Figure 4B:
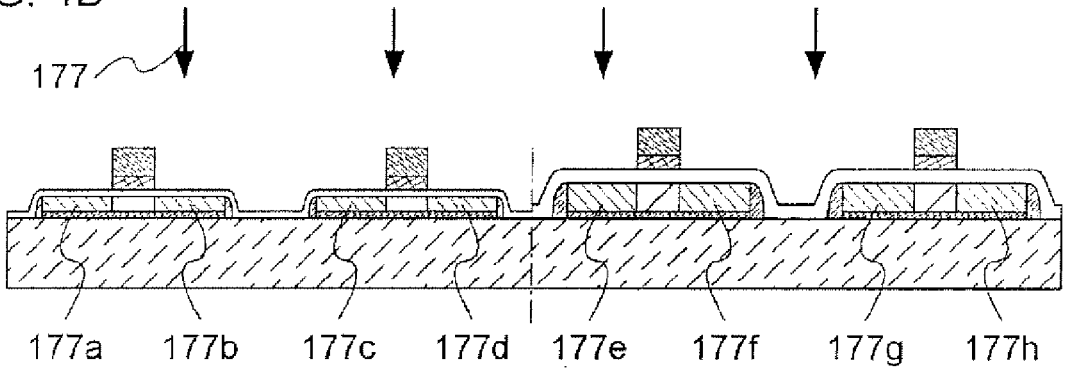
Figure 4C:
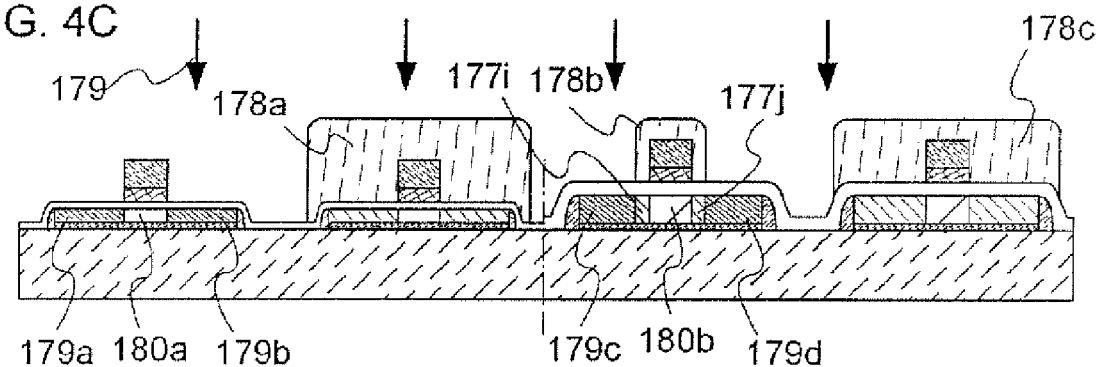
Figure 4D:
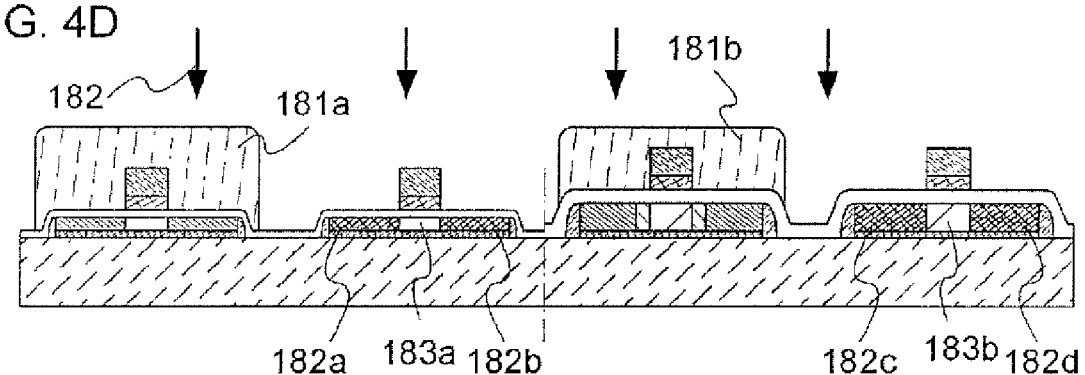

Then, as shown in FIG. 3D, gate insulating films 171 and 172 are formed to cover the surfaces and the end portions of the semiconductor layers 151, 152, 161, and 162 enough.

Preferably, by increasing the thickness of the insulating films in the regions which are in contact with the side surfaces of the semiconductor layers 151, 152, 161, and 162, electric field concentration at the end portions of the semiconductor layers 151, 152, 161, and 162 can be alleviated, and generation of leakage current, or the like can be prevented.

The gate insulating films 171 and 172 having different thicknesses are formed in the following manner: an insulating film is formed by a plasma CVD method, a sputtering method, or the like and selectively etched on the periphery of a region, in which the semiconductor layers 151 and 152 are provided, to be thinned. Reduction in thickness of the gate insulating film 171 has an effect of driving the transistors, which are later formed with the semiconductor layers 151 and 152 used as active layers, at high speed and low voltage. If the gate insulating film 172 is thick, transistors, which are later formed with the semiconductor layers 161 and 162 used as active layers, can have high resistance to a high voltage and thus can have high reliability.

A thickness of the gate insulating film 171 may be from 1 to 10 nm, more preferably, approximately 5 nm. On the other hand, a thickness of the gate insulating film 172 may be from 50 to 150 nm, more preferably, from 60 to 80 nm.

The gate insulating films 171 and 172 may each be formed using silicon oxide or may be formed to have a layered structure of silicon oxide and silicon nitride. The gate insulating films 171 and 172 may each be formed by stacking an insulating film by a plasma CVD method or a low-pressure CVD method, or may each be formed by solid-phase oxidation or solid-phase nitridation using plasma treatment. Alternatively, the gate insulating films may be formed by oxidizing or nitriding surfaces of the semiconductor layers 151, 152, 161, and 162 by plasma treatment. The insulating films obtained by surface self-oxidation of the semiconductor layers are dense, have high withstand voltage, and are highly reliable.

Figure 6A:
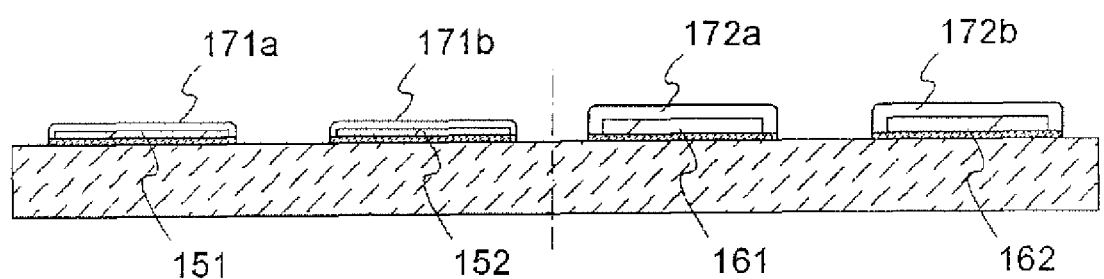
FIGS. 6A and 6B are diagrams illustrating manufacturing steps of a semiconductor device of the present invention.

In the case of forming the insulating films on the surfaces of the semiconductor layers by surface self-oxidation, as shown in FIG. 6A, first, the surfaces of the semiconductor layers 151 and 152 are self-oxidized while a mask is selectively formed over a region in which the semiconductor layers 161 and 162 are provided so that the gate insulating films 171a and 171b are obtained, and then the surfaces of the semiconductor layers 161 and 162 are self-oxidized while a mask is selectively formed over a region in which the semiconductor layers 151 and 152 are provided so that the gate insulating films 172a and 172b are obtained. Thus, the thin gate insulating films 171a and 171b may be formed separately from the thick gate insulating films 172a and 172b.

Figure 6B:
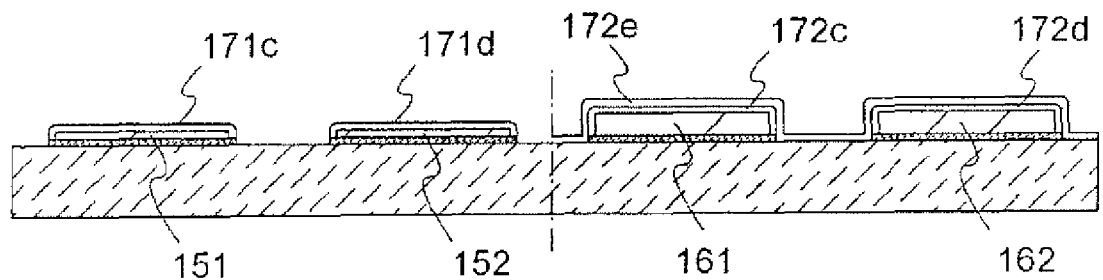

Alternatively, as shown in FIG. 6B, the surfaces of the semiconductor layers 151, 152, 161, and 162 are self-oxidized so that the thin gate insulating films 171c, 171d, 172c, and 172d are simultaneously formed, and then the thin gate insulating film 172e is selectively formed in a region in which the semiconductor layers 161 and 162 are provided. Thus, the thick gate insulating films may be formed by stacking the thin gate insulating films.

In the case of forming the insulating films on the surfaces of the semiconductor layers by surface self-oxidation of the semiconductor layers, coverage with the insulating films at the end portions is naturally favorable. Therefore, such formation of the insulating layers covering the end portions of the semiconductor layers as shown in FIG. 3C may be omitted.

For solid-phase oxidation or solid-phase nitridation by plasma treatment, it is preferable to use plasma excited by microwave (typically, 2.45 GHz) at an electron density of from $1 \times 10^{11}$ $cm^{-3}$ to $1 \times 10^{13}$ $cm^{-3}$ and at an electron temperature of from 0.5 eV to 1.5 eV. This is in order to form a dense insulating film and to obtain a practical reaction rate in solid-phase oxidation or solid-phase nitridation at lower than or equal to 500° C.

The oxidation of the surface of the semiconductor layer by this plasma treatment is performed in an oxygen atmosphere (for example, in an atmosphere containing oxygen ($O_2$) or dinitrogen monoxide ($N_2O$) and a rare gas (containing at least one of He, Ne, Ar, Kr, or Xe) or in an atmosphere containing oxygen or dinitrogen monoxide, hydrogen ($H_2$) and a rare gas). The nitridation by this plasma treatment is performed in a nitrogen atmosphere (for example in an atmosphere containing nitrogen ($N_2$) and a rare gas (containing at least one of He, Ne, Ar, Kr, or Xe), in an atmosphere containing nitrogen, hydrogen and a rare gas, or in an atmosphere containing $NH_3$ and a rare gas). As the rare gas, for example, Ar can be used. Alternatively, a gas in which Ar and Kr are mixed may be used.

Note that the plasma treatment includes oxidation treatment, nitridation treatment, oxynitridation treatment, hydrogenation treatment and surface modifying treatment on a semiconductor layer, an insulating layer, and a conductive layer. In each treatment, a gas to be supplied can be selected in accordance with its purpose.

The semiconductor layer may be subjected to oxidation treatment or nitridation treatment as follows. First, a treatment chamber is evacuated, and a plasma treatment gas containing oxygen or nitrogen is introduced from a gas supply portion. A substrate has a room temperature or is heated to a temperature of from 100 to 550° C. by a temperature control portion.

Next, microwaves are supplied to an antenna from the microwave supply portion. Then, the microwaves are introduced into the treatment chamber from the antenna through a dielectric plate, whereby plasma is generated. By excitation of plasma with microwave introduction, plasma with a low electron temperature (lower than or equal to 3 eV, preferably lower than or equal to 1.5 eV) and a high electron density (higher than or equal to $1\times10^{11}$ $cm^{-3}$) can be generated. With oxygen radicals (which may include OH radicals) and/or nitrogen radicals (which may include NH radicals) generated by this high-density plasma, the surface of the semiconductor layer can be oxidized and/or nitrided. A rare gas such as argon is mixed into the plasma treatment gas, and thus oxygen radicals or nitrogen radicals can be effectively generated by excited species of the rare gas. This method enables solid-phase oxidation, solid-phase nitridation or solid-phase oxynitridation at a low temperature of lower than or equal to 500° C. by efficient utilization of the active radicals excited with the plasma.

Through such solid-phase oxidation treatment or solid-phase nitridation treatment by the plasma treatment as described above, an insulating layer similar to a thermal oxide film, which is formed at from 950 to 1050° C., can be obtained even with the use of a glass substrate having a temperature limit of lower than or equal to 700° C. In other words, a film having high reliability can be formed as a gate insulating layer of a transistor.

For formation of the gate insulating films, a high dielectric constant material may be used. When a high dielectric constant material is used for the gate insulating films, gate leakage current can be reduced. As the high dielectric constant material, zirconium dioxide, hafnium oxide, titanium dioxide, tantalum pentoxide, or the like can typically be used. Further, a silicon oxide layer may be formed by solid-phase oxidation by plasma treatment.

As a method for forming a thin silicon oxide film, the surface of the semiconductor region can be oxidized by a GRTA method, an LRTA method, or the like to form a thermal oxide film, so that a thin silicon oxide film may be formed. Note that a rare gas element such as argon is preferably contained in a reaction gas and mixed into an insulating film to be formed, in order to form a dense insulating film having a small gate leakage current at a low film formation temperature.

Then, a first conductive film having a thickness of from 20 to 100 nm and a second conductive film having a thickness of from 100 to 400 nm, each of which serves as a gate electrode layer, are stacked over the gate insulating films 171 and 172, respectively. The first conductive film and the second conductive film can be formed by a sputtering method, an evaporation method, a CVD method, or the like. The first conductive film and the second conductive film may be formed of an element selected from tantalum (Ta), tungsten (W), titanium (Ti), molybdenum (Mo), aluminum (Al), copper (Cu), chromium (Cr), or neodymium (Nd), or an alloy material or a compound material containing any of the above elements as its main component. Alternatively, a semiconductor film typified by a polycrystalline silicon film doped with an impurity element such as phosphorus, or an AgPdCu alloy may be used as the first conductive film and the second conductive film. The conductive film is not limited to the two-layer structure, and for example, may have a three-layer structure where a tungsten film with a thickness of 50 nm as a first conductive film, an aluminum-silicon alloy (Al—Si) film with a thickness of 500 nm as a second conductive film, and a titanium nitride film with a thickness of 30 nm as a third conductive film are sequentially stacked. In the case of the three-layer structure, tungsten nitride may be used instead of tungsten for the first conductive film; an aluminum-titanium alloy (Al—Ti) film may be used instead of an aluminum-silicon (Al—Si) alloy film for the second conductive film; or a titanium film may be used instead of a titanium nitride film for the third conductive film as well. Alternatively, a single-layer structure may be used. In this embodiment mode, a tantalum nitride film with a thickness of 30 nm is formed as the first conductive film and tungsten (W) with a thickness of 370 nm is formed as the second conductive film.

Next, the first conductive film and the second conductive film are processed into a desired shape to form first gate electrode layers 173a to 176a, and second gate electrode layers 173b to 176b, and a second gate electrode layer 314 (see FIG. 4A) The first gate electrode layers and the second gate electrode layers can be etched to have a desired taper shape by adjusting an etching condition (the power applied to a coil electrode layer, the power applied to an electrode layer on the substrate side, an electrode temperature on the substrate side, and the like) as appropriate by an ICP (inductively coupled plasma) etching method. Further, an angle and the like of the taper shape can also be controlled by the shape of the mask. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate.

This embodiment mode will describe the example where the first gate electrode layer and the second gate electrode layer are formed to have perpendicular side surfaces; however, the present invention is not limited thereto. Both the first gate electrode layer and the second gate electrode layer may be formed into tapered shapes, or one of the first gate electrode layer and the second gate electrode layer may be formed into a tapered shape and the other may be formed to have a perpendicular side surface by anisotropic etching. The taper angles may differ between the stacked gate electrode layers or may be the same. Due to the tapered shape, coverage with a film that is stacked thereover is improved and defects are reduced; therefore, reliability is enhanced. Further, the first gate electrode layers 173a and 174a and the second gate electrode layers 173b and 174b, which are formed over the semiconductor layers 151 and 152, may be formed to have a shorter length in a channel length direction than the first gate electrode layers 175a and 176a and the second gate electrode layers 175b and 176b, which are formed over the semiconductor layers 161 and 162. This is because the semiconductor layers 151 and 152 are thin and the gate insulating film 171 is also thin, so further miniaturization can be achieved with the characteristics of transistors maintained.

The gate insulating films 171 and 172 may be etched to some extent and reduced in thickness (so-called film reduction) by the etching step for forming the gate electrode layer.

Next, the semiconductor layers are doped with an n-type impurity element 177, with the use of the first gate electrode layers 173a to 176a and the second gate electrode layers 173b to 176b as masks. Thus, first n-type impurity regions 177a, to 177h are formed (see FIG. 4B). In this embodiment mode, doping is performed by using phosphine ($PH_3$) as a doping gas containing an impurity element (the doping gas is obtained by diluting $PH_3$ with hydrogen ($H_2$); a rate of $PH_3$ in the gas is 5%) under conditions that a gas flow rate is 80 sccm, a beam current is 54 μA/cm, an acceleration voltage is 50 kV, and an irradiation dose is $7.0 \times 10^{13}$ ions/cm$^2$. Here, doping is performed such that each of the first n-type impurity regions 177a to 177h contains the n-type impurity element at a concentration of approximately from $1 \times 10^{17}$ to $5 \times 10^{18}$/cm$^3$. In this embodiment mode, phosphorus (P) is used as the n-type impurity element.

Next, masks 178a to 178c which cover the semiconductor layer 152, part of the semiconductor layer 161, and the semiconductor layer 162 respectively are formed. Then, the semiconductor layers are doped with an n-type impurity element 179 with the use of the masks 178a to 178c, the first gate electrode layer 173a, and the second gate electrode layer 173b as masks. Thus, second n-type impurity regions 179a to 179d and third r-type impurity regions 177i and 177j are formed. In this embodiment mode, doping is performed by using $PH_3$ as a doping gas containing an impurity element (the doping gas is obtained by diluting $PH_3$ with hydrogen ($H_2$); a rate of $PH_3$ in the gas is 5%) under conditions that a gas flow rate is 80 sccm, a beam current is 540 μA/cm, an acceleration voltage is 70 kV, and an irradiation dose is $5.0 \times 10^{15}$ ions/cm$^2$. Here, doping is performed such that each of the second n-type impurity regions 179a to 179d contains the n-type impurity element at a concentration of approximately from $5 \times 10^{19}$ to $5 \times 10^{20}$/cm$^3$. Further, a channel formation region 180a and a channel formation region 180b are formed in the semiconductor layer 151 and the semiconductor layer 161, respectively (see FIG. 4C).

The second n-type impurity regions 179a to 179d are n-type high-concentration impurity regions and function as source regions and drain regions of n-channel transistors. On the other hand, the third n-type impurity regions 177i and 177j are n-type low-concentration impurity regions and function as so-called lightly doped drain (LDD) regions. Further, being formed in Loff regions that are not covered with the gate electrode layers, the third n-type impurity regions 177i and 177j have an effect of reducing an off current. As a result, a highly reliable transistor at the time of high voltage application can be manufactured.

After the masks 178a to 178c which are described above are removed, masks 181a and 181b which cover the semiconductor layers 151 and 161, respectively, are formed. Then, the semiconductor layers are doped with a p-type impurity element 182 with the use of the masks 181a and 181b, the first gate electrode layers 174a and 176a, and the second gate electrode layer 174b and 176b as masks, Thus, p-type impurity regions 182a to 182d are formed. In this embodiment mode, boron (B) is used as an impurity element, therefore, doping is performed by using diborane ($B_2H_6$) as a doping gas containing an impurity element (the doping gas is obtained by diluting $B_2H_6$ with hydrogen ($H_2$); a rate of $B_2H_6$ in the gas is 15%) under conditions that a gas flow rate is 70 sccm, a beam current is 180 μA/cm, an acceleration voltage is 80 kV, and an irradiation dose is $2.0 \times 10^{15}$ ions/cm$^2$. Here, doping is performed such that each of the p-type impurity regions 182a to 182d contains the p-type impurity element at a concentration of approximately from $1 \times 10^{20}$ to $5 \times 10^{21}$/cm$^3$. Further, channel formation regions 183a and 183b are formed in the semiconductor layers 152 and 162, respectively (see FIG. 4D).

The p-type impurity regions 182a to 182d are p-type high-concentration impurity regions and function as source regions and drain regions of p-channel transistors.

In order to activate the impurity element, heat treatment, intense light to irradiation, or laser beam irradiation may be performed. At the same time as the activation, plasma damage to the gate insulating layer and plasma damage to the interface between the gate insulating layer and the semiconductor layer can be ameliorated.

Next, an interlayer insulating film covering the gate electrode layer and the gate insulating layer is formed. In this embodiment mode, a single-layer structure of an interlayer insulating film 184 is employed. As the interlayer insulating film 184, a silicon nitride film, a silicon nitride oxide film, a silicon oxynitride film, a silicon oxide film, or the like can be formed by a sputtering method or a plasma CVD method. Alternatively, other insulating films containing silicon may be used for a layered structure including two or more layers (see FIG. 5A).

Further, heat treatment is performed at from 300 to 550° C. for 1 to 12 hours in a nitrogen atmosphere to hydrogenate the semiconductor layer. Preferably, this heat treatment is performed at from 400 to 500° C. In this step, dangling bonds in the semiconductor layer are terminated by hydrogen contained in the insulating film 184 that is an interlayer insulating layer. In this embodiment mode, heat treatment is performed at 410° C. for an hour.

The interlayer insulating film 184 may be formed using a material selected from aluminum nitride (AlN), aluminum oxynitride (AlON), aluminum nitride oxide containing more nitrogen than oxygen (AlNO), aluminum oxide, diamond-like carbon (DLC), nitrogen-containing carbon (CN), or any other substance containing an inorganic insulating material. Alternatively, a siloxane resin may be used. It is to be noted that a siloxane resin is a resin containing a Si—O—Si bond. The skeletal structure of siloxane is formed of a bond of silicon (Si) and oxygen (O). As a substituent, an organic group containing at least hydrogen (such as an alkyl group or aromatic hydrocarbon) is used. Alternatively, a fluoro group or a fluoro group and an organic group containing at least hydrogen may be used as the substituent. Alternatively, an organic insulating material such as polyimide, acrylic, polyamide, polyimide amide, resist, benzocyclobutene, or polysilazane may be used. Still alternatively, a coating film having favorable planarity, which is formed by a coating method, may be used.

The interlayer insulating film 184 can be formed by dipping, spray coating, a doctor knife, a roll coater, a curtain coater, a knife coater, an evaporation method, or the like instead of a sputtering method or a plasma CVD method, which is described above. Alternatively, the interlayer insulating film 184 may be formed by a droplet discharging method. In the case of a droplet discharging method, a material solution can be economized on. Alternatively, a method by which a pattern can be transferred or drawn, like a droplet discharging method, for example, a printing method (a method for forming a pattern, such as screen printing or offset printing), or the like may be used.

Next, a contact hole (opening) is formed in the interlayer insulating film and the gate insulating film so as to reach the semiconductor layer and the gate electrode layer, with the use of a mask made of a resist. Etching may be performed only once or a plurality of times depending on the etching selectivity of the materials used for the insulating films. Further, wet etching, dry etching, or both wet etching and dry etching may be employed. As an etchant of wet etching, it is preferable to use a solution containing fluorinated acid such as a mixed solution containing ammonium hydrogen fluoride and ammonium fluoride. As an etching gas, a chlorine-based gas typified by $Cl_2$, $BCl_3$, $SiCl_4$, or $CCl_4$; a fluorine-based gas typified by $CF_4$, $SF_6$, or $NF_3$; or $O_2$ can be used as appropriate. Further, an inert gas may be mixed into the etching gas. As the inert gas element that is mixed, one kind of element or a plurality of kinds of elements selected from He, Ne, Ar, Kr, and Xe can be used.

A conductive film is formed to cover the opening portion, and the conductive film is etched to have a desired shape by a photolithography method, so that electrodes 185a to 185i each of which is electrically connected to a part of a source region or a drain region, or a gate electrode are formed. Alternatively, the electrodes 185a to 185i may be formed by selectively forming a conductive layer in a predetermined position by a droplet discharging method, a printing method, an electrolytic plating method, or the like. Alternatively, a reflow method or a damascene method may be used. The electrodes 185a to 185i are formed using a metal such as Ag, Au, Cu, Ni, Pt Pd, Rh, W, Al, Ta, Mo, Cd, Zn, Fe, Ti, Zr, or Ba; Si; Ge; or an alloy or metal nitride thereof. Alternatively, a layered structure of any of these materials may be used. In this embodiment mode, a 60 nm thick titanium (Ti) film, a 40 nm titanium nitride film, a 700 nm thick aluminum film, and a 200 nm thick titanium (Ti) film are stacked and formed to have a desired shape.

Figure 5A:
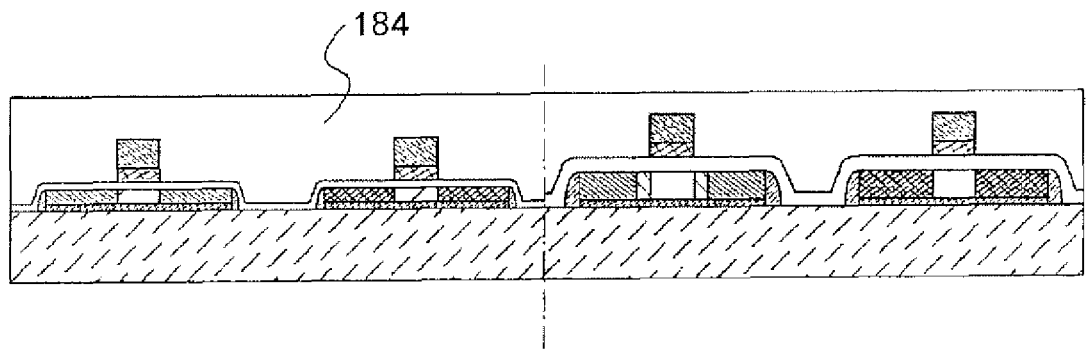
FIGS. 5A to 5C are diagrams illustrating manufacturing steps of a semiconductor device of the present invention.
Figure 5B:
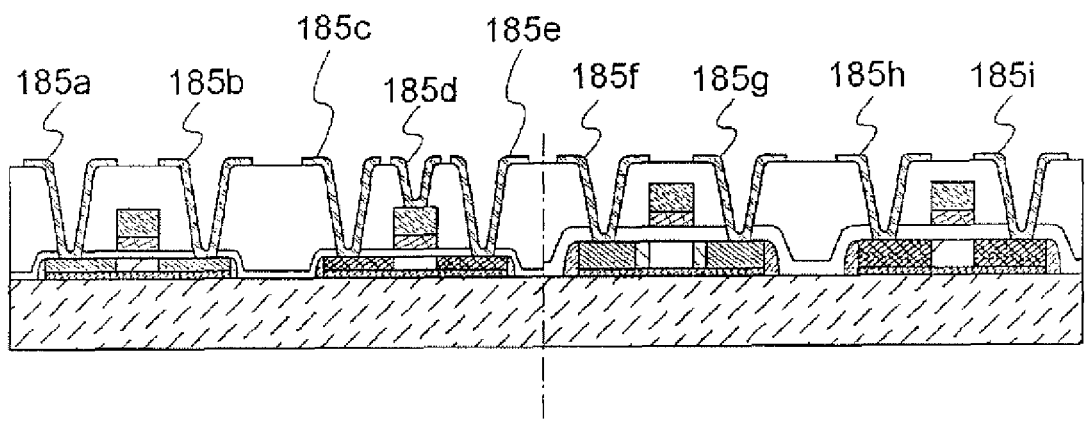
Figure 5C:
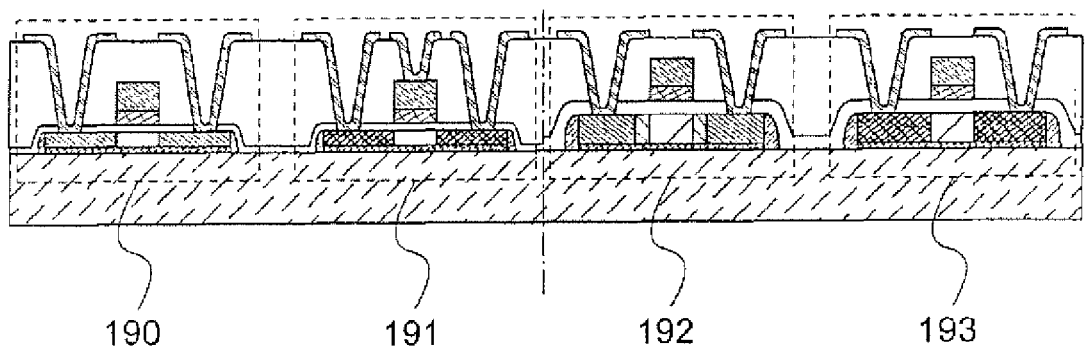

Through the above process, a semiconductor device is completed, which includes the transistors 190 and 191 included in a first circuit group and the transistors 192 and 193 included in a second circuit group over one substrate (see FIG. 5C).

In the semiconductor device described in this embodiment mode, semiconductor layers of the transistors 190 and 191 are thinner than those of the transistors 192 and 193. Further, gate insulating films of the transistors 190 and 191 are thinner than those of the transistors 192 and 193.

In the semiconductor device described in this embodiment mode, thicknesses of the semiconductor layers 151 and 152 of the transistors 190 and 191 may each be, for example, from 5 to 30 nm, more preferably, from 10 to 20 nm. On the other hand, thicknesses of the semiconductor layers 161 and 162 of the transistors 192 and 193 may each be, for example, from 25 to 100 nm, more preferably, front 50 to 60 nm.

In the semiconductor device described in this embodiment mode, thicknesses of the gate insulating films of the transistors 190 and 191 may each be, for example, from 1 to 10 nm, more preferably, approximately 5 nm. On the other hand, thicknesses of the gate insulating films of the transistors 192 and 193 may each be, for example, from 50 to 150 nm, more preferably, from 60 to 80 nm.

In the case where a film thickness of the channel formation region is large and the channel length is short, a current flows on the lower side in the channel formation region at a gate voltage of lower than or equal to the threshold voltage and in a subthreshold region, by the influence of electric field between the source and the drain. Therefore, the subthreshold value is increased, and the threshold voltage is reduced When a film thickness of the channel formation region is reduced, a path where current flows on the lower side in the channel formation region is blocked, and thus leakage current can be suppressed. Therefore, increase in the subthreshold value can be suppressed, and reduction in the threshold voltage can be suppressed. Accordingly, when a film thickness of the channel formation region is reduced, the amount of change in the threshold voltage toward negative values can be suppressed in a region where the channel length is short, and a thin film transistor with a small subthreshold value can be manufactured. Since the subthreshold value is reduced, the threshold voltage can be set to be low while a current flowing between the source and the drain at a gate voltage of 0 V is suppressed.

Reduction in thickness of the semiconductor layers 151 and 152 included in the transistors 190 and 191 acts on an entire region of the channel formation region to be depleted, thereby suppressing the short-channel effect. Further, the threshold voltages of the transistors can be reduced. Since miniaturization of the transistors 190 and 191 can be achieved by reducing the thicknesses of the semiconductor layers (or, the gate insulating layers as well), low-voltage driving, high-speed operation, and low power consumption can be achieved.

On the other hand, by forming the semiconductor layers 161 and 162 of the transistors 192 and 193 thicker than the semiconductor layers 151 and 152 of the transistors 190 and 191, high resistance to a high applied voltage and high reliability can be achieved. Similarly, by increasing a thickness of the gate insulating films, gate leakage can be reduced.

Thus, the present invention realizes that the thicknesses of the semiconductor layers are varied so that a plurality of optimal transistors for respective characteristics that are needed are formed over one substrate. Note that the present invention can be applied to not only a method for manufacturing transistors, which is described in this embodiment mode, but also other structures such as a top-gate (planar) structure, a bottom-gate (inversely staggered) structure, or a dual-gate structure that has two gate electrode layers above and below a channel formation region with gate insulating films interposed therebetween.

Figure 1B:
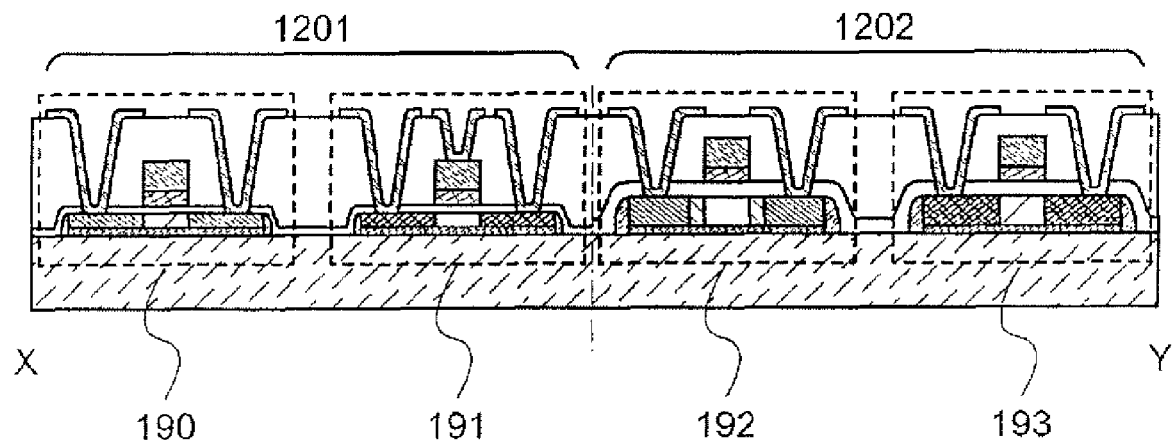

FIGS. 1A and 1B show an example of the semiconductor device using the present invention, which is formed according to this embodiment mode. FIG. 1A is a plan view of the semiconductor device formed according to this embodiment mode and FIG. 1B is a cross-sectional view taken along X-Y in FIG. 1A.

As shown in FIG. 1A, a first circuit group 1201 and a second circuit group 1202 are formed over the base substrate 101. The first circuit group 1201 is formed using the transistors 190 and 191 which are formed using thin semiconductor layers and thin gate insulating films, and the second circuit group 1202 is formed using the transistors 192 and 193 which are formed using thick semiconductor layers and thick gate insulating films. The first circuit group 1201 is a circuit group for which high-speed operation and low-voltage operation are mainly required, and the second circuit group 1202 is a circuit group for which low current leakage and reliability at the time of high voltage application are mainly required.

An example of the semiconductor device having a display function, to which the present invention is applied, is described with reference to FIGS. 11 to 13.

Figure 11:
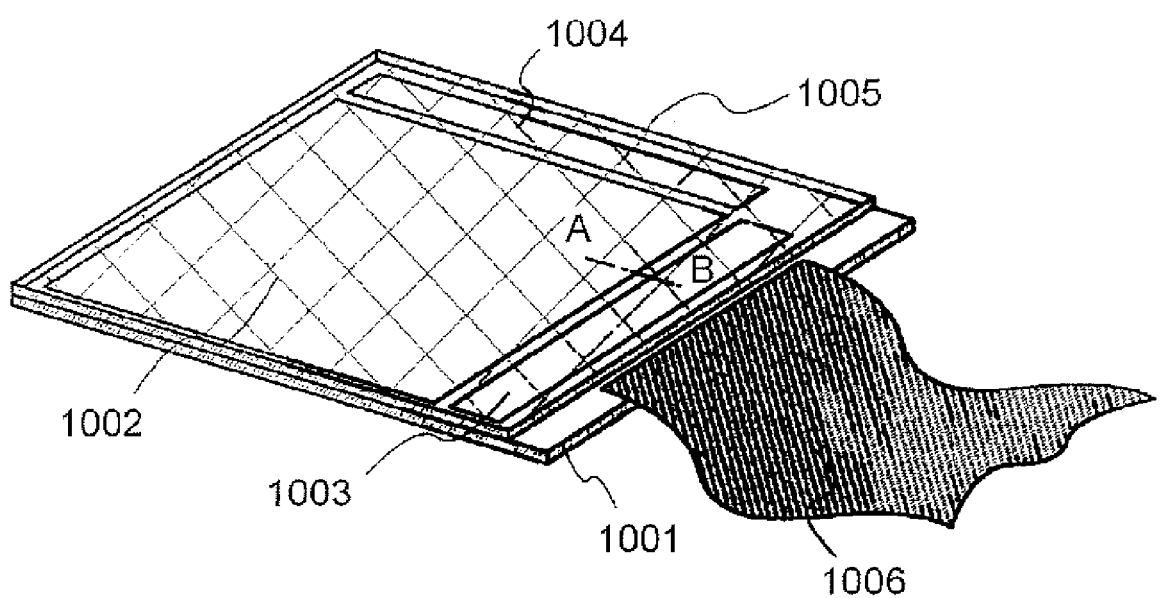
FIG. 11 is a diagram illustrating one mode of a semiconductor device of the present invention.

FIG. 11 shows an active matrix display device. A pixel portion 1002 where a plurality of pixel circuits are arranged in matrix, a data driver 1003, a scan driver 1004 are formed over an insulating substrate 1001. Further, a top surface of the insulating substrate 1001 is hermetically sealed with a counter substrate 1005. A control signal, an image signal, and driving power which are required for driving a display device are supplied from external through a flexible printed circuit (FPC) 1006.

Here, the data driver 1003 is a circuit which performs a process for inputting an image signal supplied from external to each pixel and for which relatively high-speed operation is required in a display device. Therefore, in this region, a circuit preferably includes a transistor formed using a thin semiconductor layer and a thin gate insulating film.

On the other hand, the scan driver 1004 operates slower than the data driver 1003, but may include a region in which a driving voltage is slightly high. The pixel portion 1002 also operates slower than the data driver 1003 and the scan driver 1004 on the periphery thereof, however, the pixel portion 1002 should hold an inputted image signal for a certain period and thus reduction in current leakage is required for a transistor which forms a pixel. Therefore, the scan driver 1004 and the pixel portion 1002 are each preferably formed using a transistor formed using a thick semiconductor layer and a thick gate insulating film.

Further, the data driver 1003 and the scan driver 1004 each operate by a control signal which is inputted from external through the FPC 1006. A driving voltage of an external controller IC or the like is lower than those of general display devices, therefore, normally, boosting a signal amplitude, or the like is performed using a level shifter or the like after the signal is inputted to the display device in many cases. However, according to the present invention, low-voltage operation can be achieved by forming each of the data driver 1003 and the scan driver 1004 with the use of a transistor formed using a thin semiconductor layer and a thin gate insulating film, so that an operating voltage can be approximately equal to that of the external controller IC or the like. Therefore, the level shifter or the like is unnecessary, which leads to reduction in circuit size or power consumption.

Note that as an active matrix display device having such a mode, a liquid crystal display, an electroluminescent (EL) display, a field-effect display, electronic paper, and the like are given. The present invention can be applied to any of these display devices.

Figure 12:
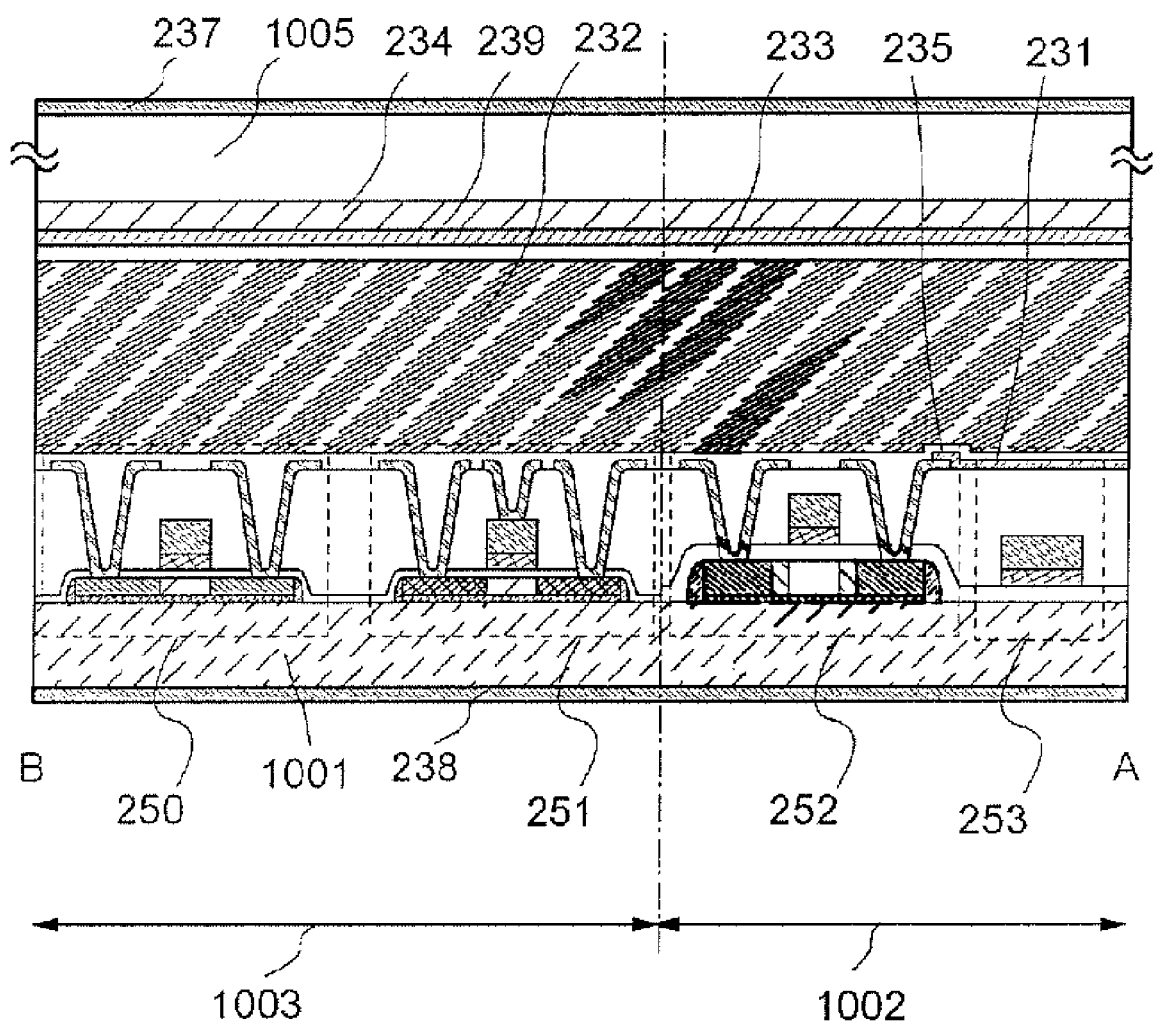
FIG. 12 is a diagram illustrating one mode of a semiconductor device of the present invention.

FIG. 12 shows an example of a liquid crystal display device in which a display element provided in the pixel portion 1002 in FIG. 11 is a liquid crystal display element. FIG. 12 is a cross-sectional view taken along A-B in FIG. 11.

Transistors 250 and 251 provided in the data driver 1003 are formed similarly to the transistors 190 and 191 in FIG. 1B and each include a thinned single-crystal semiconductor layer and a thin gate insulating film. On the other hand, a transistor 252 provided in the pixel portion 1002 is formed similarly to the transistors 192 and 193 in FIG. 1B and each include a thick single-crystal semiconductor layer and a thick gate insulating film. Note that a capacitor 253 is formed in the pixel portion 1002.

A pixel electrode layer 235 is formed to be in contact with an electrode of the transistor 252. In the case of manufacturing a light-transmitting liquid crystal display panel, for the pixel electrode layer 235, indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide added with silicon oxide (ITSO), or the like may alternatively be used. As a reflective metal thin film, a conductive film formed of titanium, tungsten, nickel, gold, platinum, silver, aluminum, magnesium, calcium, lithium, or alloy thereof, or the like can be used.

The pixel electrode layer 235 can be formed by an evaporation method, a sputtering method, a CVD method, a printing method, a droplet discharging method, or the like.

Then, an insulating layer 231 called an alignment film is formed by a printing method or a spin coating method so as to cover the pixel electrode layer 235. It is to be noted that the insulating layer 231 can be selectively formed by a screen printing method or an off-set printing method. Thereafter, rubbing is performed. Then, a sealing material 282 is formed in a peripheral region of the pixels by a droplet discharging method.

After that, the counter substrate 1005 provided with the insulating layer 233 serving as an alignment film, a conductive layer 239 serving as a counter electrode, a colored layer 234 serving as a color filter, and a polarizing plate 237 is attached to the insulating substrate 1001 serving as a base substrate, which is a TFT substrate, with a spacer 281 interposed therebetween, and then a liquid crystal layer 232 is provided in a space therebetween. Thus, a liquid crystal display panel can be manufactured. A polarizing plate 238 is also provided on the side of the insulating substrate 1001 serving as a base substrate, which is opposite to a side where an element is formed. A filler may be mixed into the sealing material, and a shielding film (black matrix) or the like may be additionally formed over the counter substrate 1005. Note that the liquid crystal layer can be formed by a dispensing method (dropping method), or a dipping method (pumping method) in which the counter substrate 1005 and the insulating substrate 1001 serving as a base substrate having an element are attached and then a liquid crystal is injected using capillary action.

Figure 13:
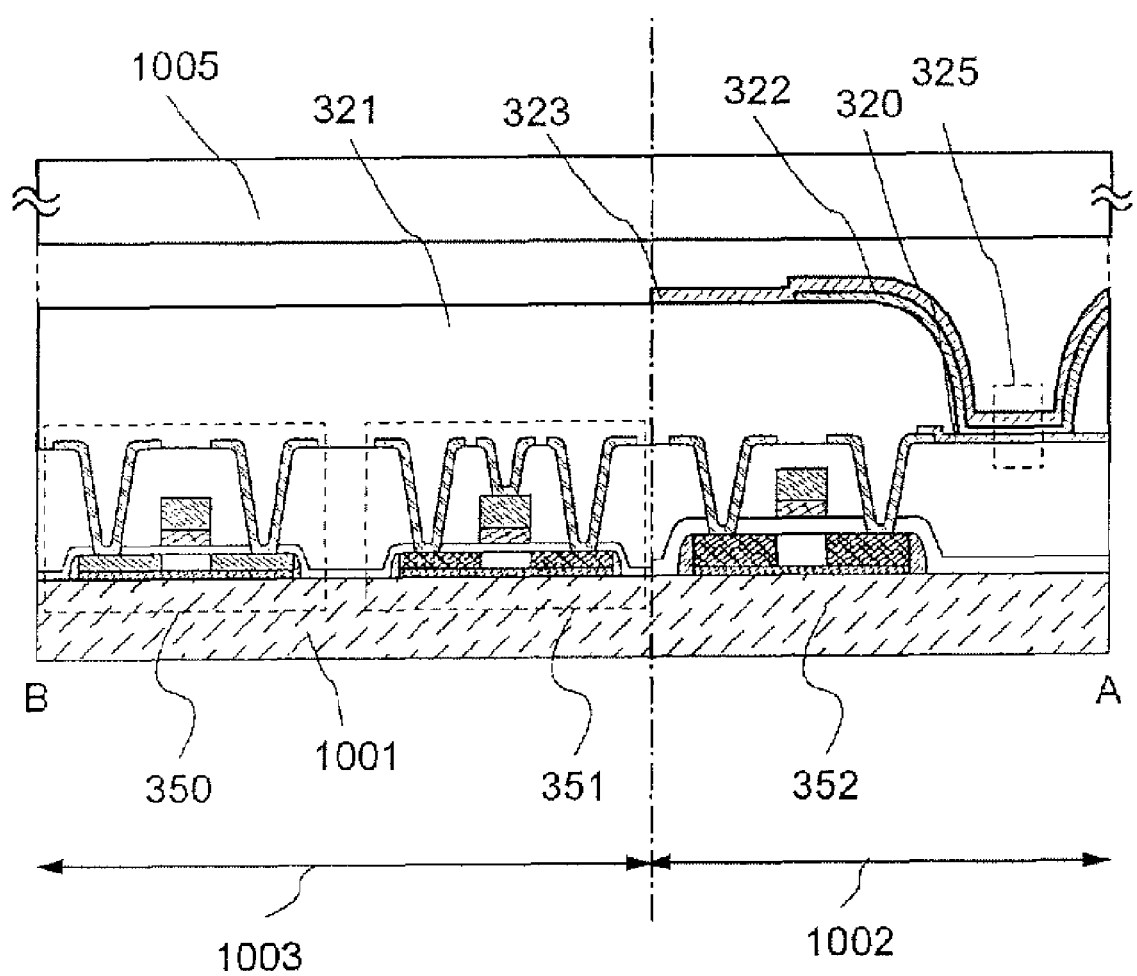
FIG. 13 is a diagram illustrating one mode of a semiconductor device of the present invention.

FIG. 13 shows an example of a light-emitting display device in which a display element provided in the pixel portion 1002 in FIG. 11 is a light-emitting element. FIG. 13 is a cross-sectional view taken along A-B in FIG. 11.

Transistors 350 and 351 provided in the data driver 1003 are formed similarly to the transistors 190 and 191 in FIG. 1B and each include a thinned single-crystal semiconductor layer and a thin gate insulating film. On the other hand, a transistor 352 provided in the pixel portion 1002 is formed similarly to the transistors 192 and 193 in FIG. 1B and each include a thick single-crystal semiconductor layer and a thick gate insulating film. Note that the pixel portion 1002 includes a light-emitting element 325 as a display element.

A first electrode layer 320 serving as a pixel electrode layer is formed to be in contact with an electrode of the transistor 352. When light is delivered from the side of the insulating substrate 1001 serving as a base substrate, the first electrode layer 320 can be formed using indium tin oxide (ITO), indium tin oxide containing silicon oxide (ITSO), indium zinc oxide containing zinc oxide (ZnO) (IZO (indium zinc oxide)), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like.

In addition, even in the case of a material that does not have a light-transmitting property, such as a metal film, when a thickness is made thin (preferably, approximately from 5 to 30 nm) so that light can be transmitted, light can be delivered through a first electrode layer 320. As a metal thin film that can be used for the first electrode layer 320, a conductive film formed of titanium, tungsten, nickel, gold, platinum, silver, aluminum, magnesium, calcium, lithium, zinc, or alloy thereof, or a film formed from a compound material containing any of the above elements as its main component, such as titanium nitride, $TiSi_xN_y$, $WSi_x$, tungsten nitride, $WSi_xN_y$, or NbN, can be used.

The connecting structure of the first electrode layer 320 is not limited to that described in this embodiment mode as long as the first electrode layer 320 is electrically connected to a source or drain electrode layer 110a. Alternatively, a structure in which an insulating layer serving as an interlayer insulating layer is formed over an electrode serving as a source or drain electrode layer and is electrically connected to the first electrode layer 320 by a wiring layer may be employed. In the case where emitted light is delivered in the direction opposite to the insulating substrate 1001 serving as a base substrate (the case where a top-emission display panel is manufactured), silver (Ag), gold (Au), copper (Cu), tungsten (W), aluminum (Al), or the like can be used.

The insulating layer 321 (also called a partition) is selectively formed. The insulating layer 321 is formed so as to have an opening over the first electrode layer 320. In this embodiment mode, the insulating layer 321 is formed over an entire surface and processed by being etched by a mask such as a resist. In the case of forming the insulating layer 321 by a droplet discharge method or a printing method, in which the insulating layer 321 can be selectively formed directly, processing by etching is not necessarily needed.

The insulating layer 321 can be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof, a heat-resistant high molecule such as polyimide, aromatic polyamide, or polybenzimidazole; or a siloxane resin material. Alternatively, a photosensitive or nonphotosensitive material such as acrylic or polyimide may be used. The insulating layer 321 preferably has a shape in which a radius of curvature changes continuously, and if it has such a shape, the coverage thereof with an electroluminescent layer 322 and a second electrode layer 323 which are formed thereover is improved.

As the electroliuminescent layer 322, materials emitting light of red (R), green (G), and blue (B) are selectively formed by an evaporation method or the like using evaporation masks. Alternatively, the materials emitting light of red (R), green (G), and blue (B) may be formed by a droplet discharging method similarly to a color filter (such as a low-molecular material or a high-molecular material), and thus materials for R, G, and B can be individually formed without the use of masks, which is preferable. A second electrode layer 323 is formed over the electroluminescent layer 322, and a display device having a display function using a light-emitting element is completed.

Although not shown in drawings, it is effective to provide a passivation film so as to cover the second electrode layer 323. A passivation film that is provided when a display device is formed may have a single-layer structure or a layered structure. The passivation film may be formed using an insulating film containing silicon nitride, silicon oxide, silicon oxynitride, silicon nitride oxide, aluminum nitride (AlN), aluminum oxynitride, aluminum nitride oxide containing more nitrogen than oxygen, aluminum oxide, diamond-like carbon, or nitrogen-containing carbon, and the insulating film can have a single-layer structure or a layered structure. Alternatively, a siloxane resin may be used. For example, a laminate of a carbon-containing nitrogen film and a silicon nitride film, an organic material, or a laminate of a high molecular such as a styrene polymer may be used, Alternatively, a siloxane material (inorganic siloxane or organic siloxane) may be used.

In that case, it is preferable to use a film which provides favorable coverage as the passivation film, and it is effective to use a carbon film, particularly, a DLC film as the passivation film. A DLC film can be formed in the range from room temperature to 100° C.; therefore, it can also be formed easily over an electroluminescent layer with low heat resistance. A DLC film has a high blocking effect against oxygen; therefore, oxidization of the electroluminescent layer can be suppressed. Accordingly, a problem such as oxidation of the electroluminescent layer during a sealing step which is subsequently performed can be prevented.

A space between the insulating substrate 1001 serving as a base substrate and the counter substrate 1005 is filled with a filler and is sealed with a sealing material. A dripping method may be used instead of filling the space with the filler Instead of the filler, an inert gas such as nitrogen may be filled. In addition, when a drying agent is provided in the display device, deterioration due to moisture in the light-emitting element can be prevented.

The light-emitting element and a liquid crystal element are sealed by a glass substrate in this embodiment mode. It is to be noted that sealing treatment is treatment for protecting a light-emitting element from moisture, and any of a method for mechanically sealing the light-emitting element by a cover material, a method for sealing the light-emitting element with a thermosetting resin or an ultraviolet light curable resin, and a method for sealing the light-emitting element by a thin film having a high barrier property such as a metal oxide film or a metal nitride film is used. As the cover material, glass, ceramics, plastics, or metal can be used, and it is necessary to use a material having a light-transmitting property in the case where light is delivered to the cover material side. The cover material and the substrate over which the light-emitting element is formed are attached to each other with a sealing material such as a thermosetting resin or an ultraviolet curable resin, and the resin is cured by heat treatment or ultraviolet light irradiation treatment to form a sealed space. It is also effective to provide a moisture absorbing material typified by barium oxide in this sealed space. This moisture absorbing material may be provided on and in contact with the sealing material, or may be provided over or on the periphery of the partition so as not to shield light from the light-emitting element. Further, the space between the cover material and the substrate over which the light-emitting element is formed can be filled with a thermosetting resin or an ultraviolet light curable resin. In this case, it is effective to add a moisture absorbing material typified by barium oxide in the thermosetting resin or the ultraviolet light curable resin.

Figure 14A:
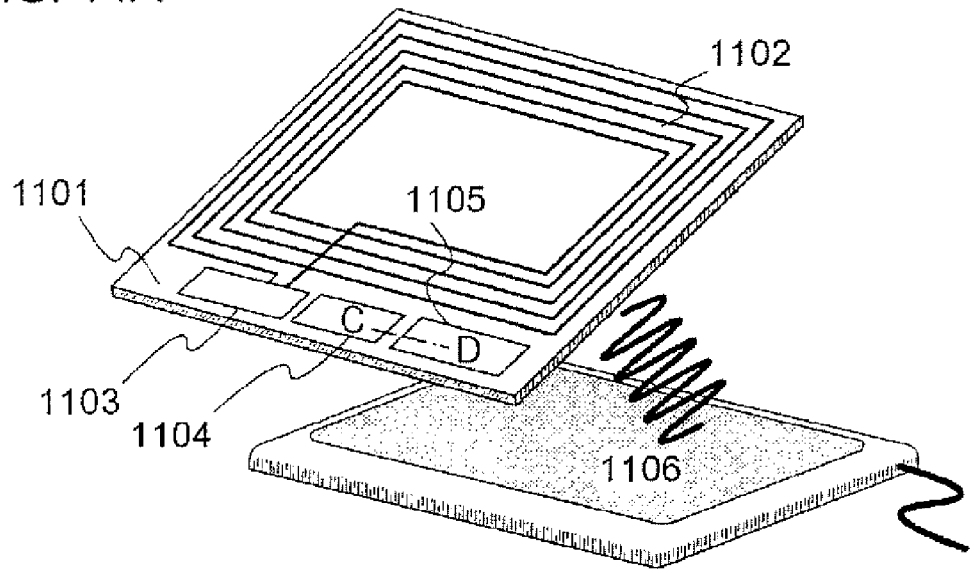
FIGS. 14A and 14B are diagrams illustrating one mode of a semiconductor device of the present invention.
Figure 14B:
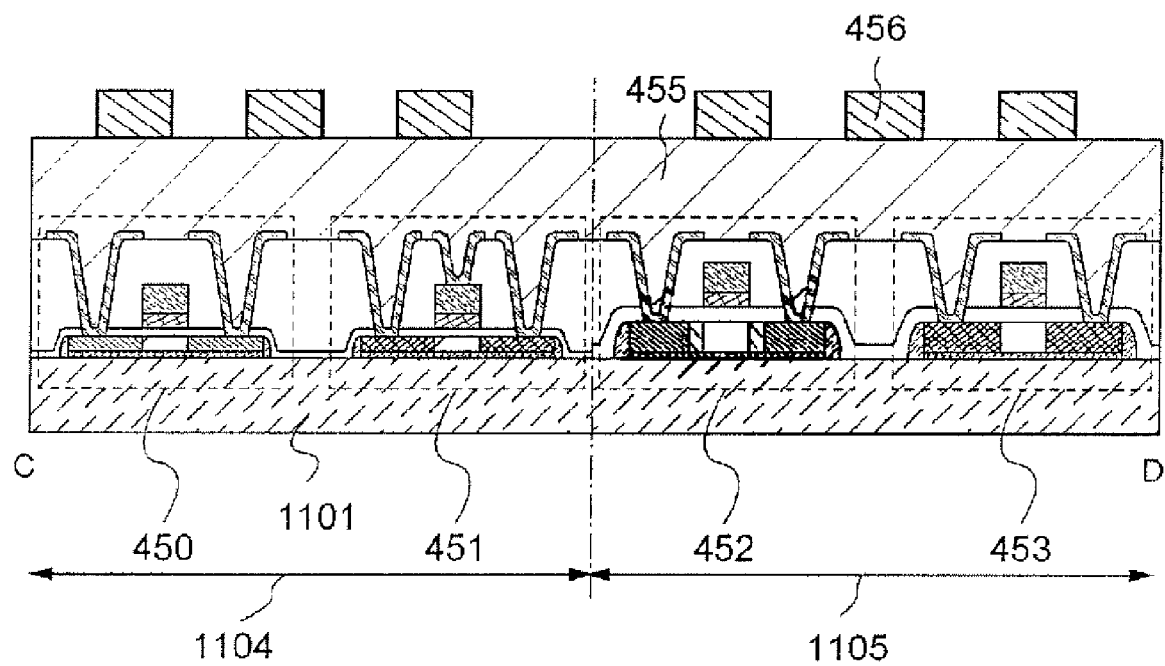

FIGS. 14A and 14B show an example of a wireless IC tag. An antenna 1102, a power supply circuit 1103 which includes a rectifier circuit or the like, a logic circuit 1104 which processes each introduction, a memory 1105, and the like are provided over an insulating substrate 1101. A carrier wave including an instruction, which is outputted from a reader/writer 1106, is received by the antenna 1102, and the power supply circuit 1103 which includes a rectifier circuit or the like utilizes the received carrier wave to generate power necessary for processing or replying to the IC tag. The received carrier wave includes an instruction from the reader/writer 1106 and when the instruction is extracted in a demodulation circuit included in the logic circuit 1104, the logic circuit 1104 reads data stored in the memory 1105 in accordance with the instruction to generate a reply signal. The reply signal is superimposed on the carrier wave in a modulation circuit and is outputted from the antenna 1102.

FIG. 14B shows a cross-sectional view taken along C-D in FIG. 14A. Transistors 450 and 451 provided in the logic circuit 1104 are formed similarly to the transistors 190 and 191 in FIG. 1B and each include a thinned single-crystal semiconductor layer and a thin gate insulating film. On the other hand, transistors 452 and 453 provided in the memory 1105 are formed similarly to the transistors 192 and 193 in FIG. 1B and each include a thick single-crystal semiconductor layer and a thick gate insulating film. Note that an insulating layer 455 is formed and a conductive layer 456 serving as an antenna is formed over the insulating layer 455. FIG. 14B schematically shows that the antenna 1102 is provided over the insulating layer 455 although not provided between C-D.

In such a wireless IC tag, the logic circuit 1104 needs to reliably operate with limited generated power, so it is necessary to reduce a driving voltage of the logic circuit 1104. Further, in the case where the memory 1105 is a ROM which performs only reading operation, such a characteristic is similarly needed. In order to form such a circuit group, a circuit is preferably formed, using a transistor which is formed using a thin semiconductor layer and a thin gate insulating film.

On the other hand, the power supply circuit 1103 which includes a rectifier circuit or the like needs to stably operate for power generation irrespective of the intensity of the carrier wave received by the antenna 1102. In the case where the antenna 1102 receives a large amount of power, a transistor included in a rectifier circuit is highly stressed and thus, sufficient reliability under such a condition is required. On the other hand, in the case where the memory 1105 has an electrical writing/rewriting function, sufficient reliability is required for the memory 1105 to reliably hold data which is written electrically. In order to form such a circuit group, a circuit is preferably formed using a transistor which is formed using a thick semiconductor layer and a thick gate insulating film.

Thus, the semiconductor device of the present invention can have low power consumption and high reliability.

Embodiment Mode 2

In this embodiment mode, an example will be described, in which a semiconductor device having a mode different from that in Embodiment Mode 1 is manufactured according to the present invention.

In Embodiment Mode 1, a method is described, in which the plurality of single-crystal semiconductor layers with two or more kinds of different thicknesses are formed over a base substrate by being attached thereto. Alternatively, it is also allowed that, for example, after an amorphous semiconductor film is formed over a base substrate, crystallization is performed to obtain a polycrystalline semiconductor film and the plurality of single-crystal semiconductor layers with different thicknesses are formed in a desired region of the polycrystalline semiconductor film, which is left with rest of the polycrystalline semiconductor film removed, by being attached to the region.

A process in which an amorphous semiconductor film is formed over a base substrate and crystallization is performed so that a polycrystalline semiconductor film is obtained does not have any limitation in this specification, and the process may be performed by selecting a known method for which a condition such as a temperature, a load, or the like in the process is suitable, as appropriate depending on a material of the base substrate. Further, a method in which the plurality of single-crystal semiconductor layers with different thicknesses are formed over the base substrate over which a polycrystalline semiconductor film is formed in a desired region may also be performed according to the procedure disclosed in Embodiment Mode 1.

Further, a method in which a transistor is formed by processing the semiconductor layer into a desired shape and forming a gate electrode, a source electrode, and a drain electrode may also be performed according to the procedure disclosed in Embodiment Mode 1.

Figure 7:
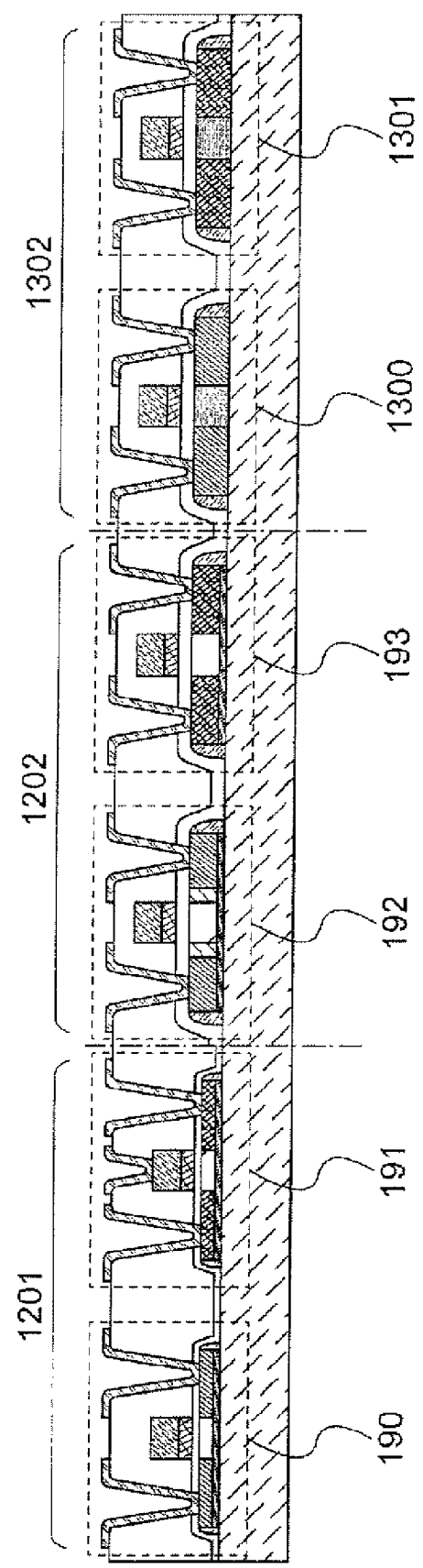
FIG. 7 is a diagram illustrating a manufacturing step of a semiconductor device of the present invention.

FIG. 7 shows a cross-sectional structure of a semiconductor device manufactured according to this embodiment mode. A first circuit group 1201, a second circuit group 1202, and a third circuit group 1302 are formed over one base substrate. The first circuit group 1201 is formed using transistors 190 and 191 which are each formed using a thin semiconductor layer and a thin gate insulating film. The second circuit group 1202 is formed using transistors 192 and 193 which are each formed using a thick semiconductor layer and a thick gate insulating film. The third circuit group 1302 is formed using transistors 1300 and 1301 which are each formed using a polycrystalline semiconductor film obtained by crystallizing an amorphous semiconductor film.

The first circuit group 1201 is a circuit group for which high-speed operation and low-voltage operation are mainly required, and the second circuit group 1202 is a circuit group for which low current leakage and reliability at the time of high voltage application are mainly required. Further, as the third circuit group, it is preferable to form a circuit group centering on a digital circuit or the like which is not easily adversely affected relatively by variation in elements because threshold voltages, field effect mobilities, or the like of transistors each formed using a polycrystalline semiconductor layer are easily varied depending on an element.

Further, according to the structure described in this embodiment mode, a large polycrystalline semiconductor layer can be easily formed over the base substrate, and thus a transistor can be formed relatively uniformly over a large area in which film formation is difficult only by attachment of a plurality of single-crystal semiconductor layers as described in Embodiment Mode 1. Therefore, the third circuit group formed in an area in which such a polycrystalline semiconductor layer is formed is suitable as a circuit group which forms a pixel portion of a display device having a large display screen.

Embodiment Mode 3

In this embodiment mode, another method for providing single-crystal semiconductor layers with different thicknesses over a base substrate is described.

While single-crystal semiconductor layers with different thicknesses may be separated from a maternal semiconductor substrate and bonded to a base substrate so that the single-crystal semiconductor layers with different thicknesses may be formed over one substrate, as described in Embodiment Mode 1, it is also allowed that a single-crystal semiconductor layer is separated from a maternal substrate and bonded to a base substrate and then selectively thinned so that the single-crystal semiconductor layers with different thicknesses are formed over one substrate.

The semiconductor layer may be thinned by one etching step or a plurality of etching steps Further, the semiconductor layer may be directly etched with an etching gas (or etchant), or a surface of the semiconductor layer may be partially modified and only the modified region may be selectively removed.

Figure 2A:
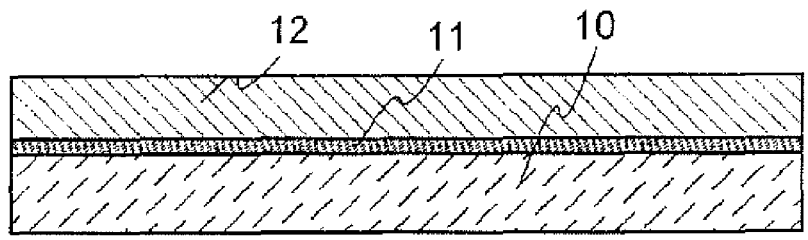
FIGS. 2A to 2D are diagrams illustrating manufacturing steps of a semiconductor device of the present invention.
Figure 2B:
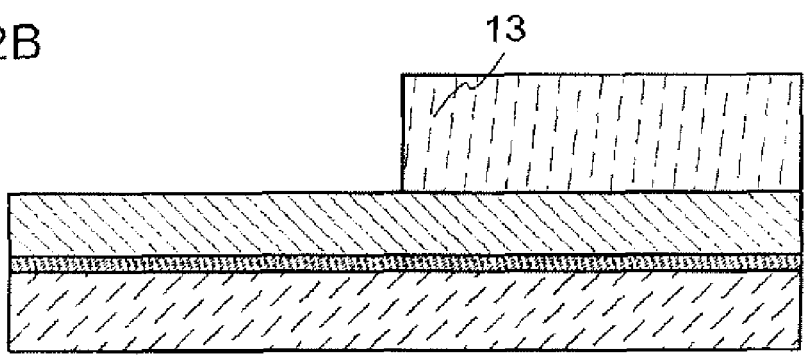
Figure 2C:
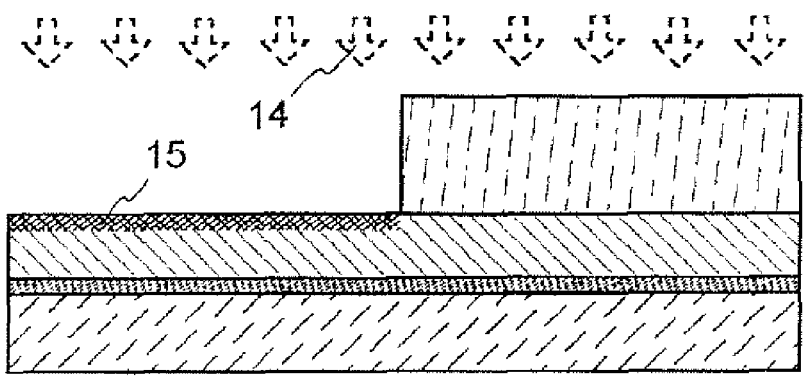
Figure 2D:
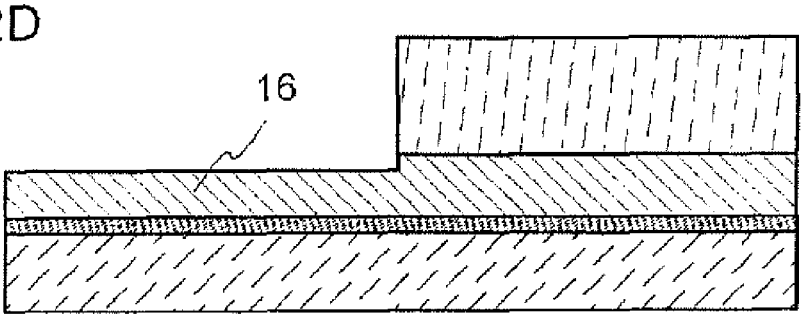

FIG. 2A to 2D show an example in which a semiconductor layer is thinned by a plurality of steps. In FIG. 2A, an insulating layer 11 having a bonding surface and a semiconductor layer 12 are formed over a base substrate 10. A mask 13 is selectively formed over a desired region in the semiconductor layer 12 (see FIG. 2B). Then, the semiconductor layer 12 is selectively modified (oxidized in this embodiment mode) by plasma treatment 14, so that a modified region 15 is formed (see FIG. 2C). After that the modified region 15 is removed with a condition (etching gas or enchant) for selectively etching only the modified region 15 without etching the semiconductor layer 12, so that a semiconductor layer 16 which is partially thinned is formed (see FIG. 2D). By performing the steps of FIGS. 2C and 2D repeatedly, the semiconductor layer can be thinned so as to have a desired thickness.

As a result, the thinned semiconductor layer 16 and the semiconductor layer 12 are obtained over the one base substrate 10. After that, a transistor group in which each semiconductor layer is used as an active layer may be formed and included in a circuit.

By using the single-crystal semiconductor layers with different thicknesses, which are formed by the above steps, a semiconductor device having low consumption and high reliability which is one mode of the present invention, can be manufactured.

Embodiment Mode 4

Figure 17A:
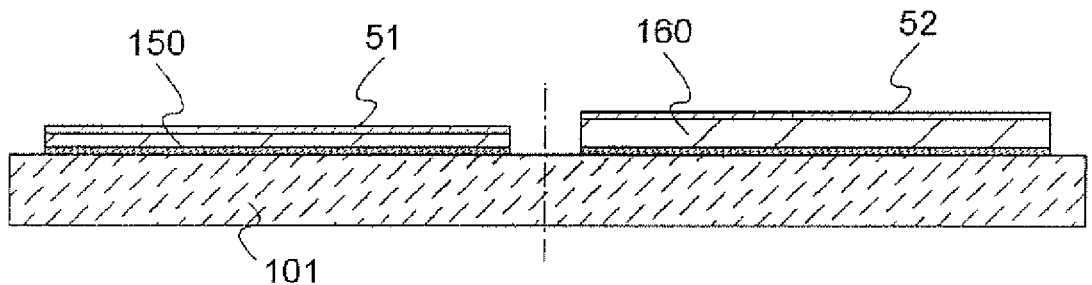
FIGS. 17A to 17E are diagrams illustrating manufacturing steps of a semiconductor device of the present invention.

In the semiconductor device of the present invention, a thin single-crystal semiconductor layer 150 and a thick single-crystal semiconductor layer 160 are formed over the base substrate 101 by being attached thereto, and there may be the case where part of a separation plane due to an ion irradiation step is left remaining on an outermost surface of each single-crystal semiconductor layer (see FIG. 17A). Separation planes 51 and 52 have planarity inferior to a surface of a normal single-crystal semiconductor layer; therefore, it is necessary to improve the surface conditions of the separation planes 51 and 52 in order to prevent defects in subsequent steps.

Figure 17B:
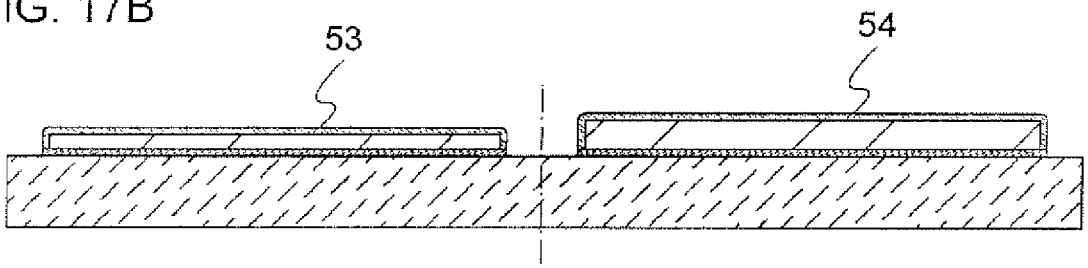
Figure 17C:
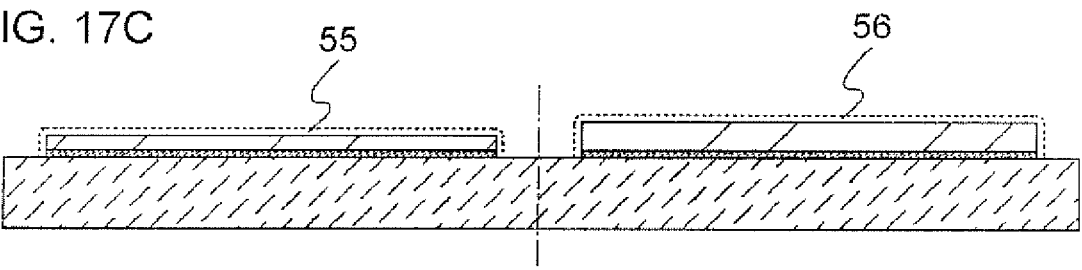

As a typical method for removing the separation planes 51 and 52, there is surface polishing by chemical mechanical polishing (CVP) as well as a method in which the separation planes 51 and 52 are oxidized (53, 54) by surface oxidation and then oxidized layers 53 and 54 are removed (55, 56) in a reducing atmosphere as shown in FIGS. 17B and 17C, or the like.

However, in the case where semiconductor layers with different thicknesses are formed on one surface as in the present invention, because there is a gap between the height of an outermost surface of each semiconductor layer and that of a surface of the base substrate that is at the reference level, it is difficult to remove a separation layer by CMP.

Figure 17D:
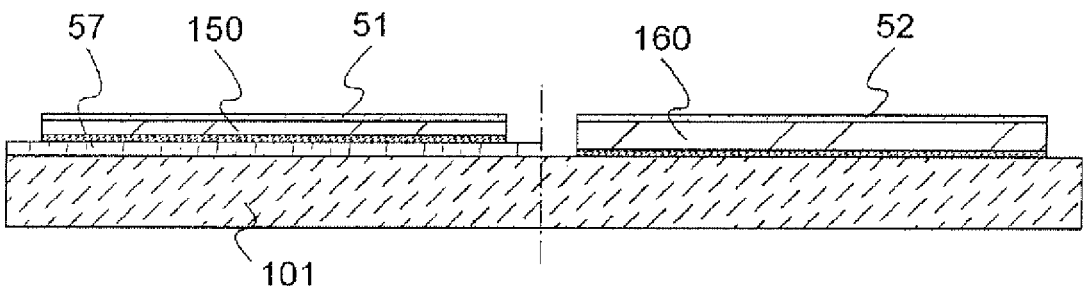

In such a case, as shown in FIG. 17D, when a base film 57 is selectively formed over a region in the base substrate 101, to which the thin single-crystal semiconductor layer 150 is to be bonded and the thin single-crystal semiconductor layers 150 and 160 are bonded, the height of an outermost surface of the thin single-crystal semiconductor layer 150 may be approximately the same as that of an outermost surface of the thick single-crystal semiconductor layer 160.

Figure 17E:
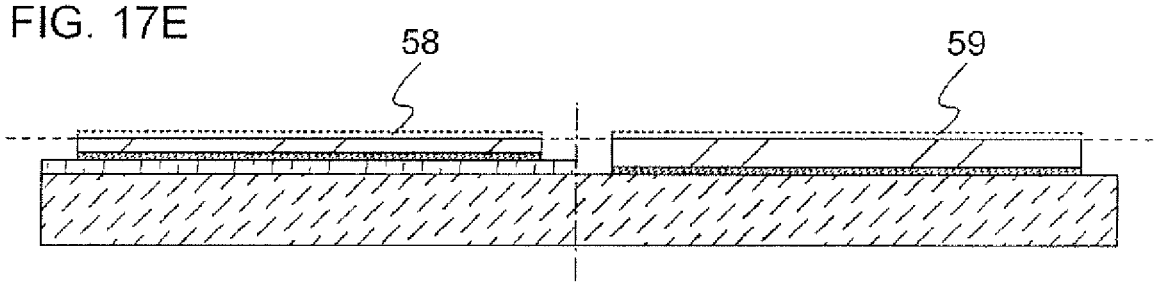

After that, as shown in FIG. 17E, the separation planes 51 and 52 of a surface of the single-crystal semiconductor layer can be removed (58, 59) through a CMP process.

By using the single-crystal semiconductor layers with different thicknesses, which are formed by the above steps, a semiconductor device having low consumption and high reliability, which is one mode of the present invention, can be manufactured.

Embodiment Mode 5

By applying the present invention, a semiconductor device having a variety of display functions can be manufactured. That is, the present invention can be applied to a variety of electronic appliances in each of which a semiconductor device having the display functions is incorporated. This embodiment mode will describe an example of an electronic appliance which includes a semiconductor device having a display function, which is high-performance and highly reliable.

Examples of electronic devices in accordance with the present invention are as follows: a television device (also referred to as simply a television, or a television receiver), a camera such as a digital camera or a digital video camera, a mobile telephone device (also referred to as simply a mobile phone or a cell phone), a portable information terminal such as PDA, a portable game machine, a computer monitor, a computer, a sound reproducing device such as a car audio system, an image reproducing device including a recording medium (specifically, a digital versatile disc (DVD)), such as a home-use game machine, and the like. Specific examples of them are described with reference to FIGS. 8A to 8E.

Figure 8A:
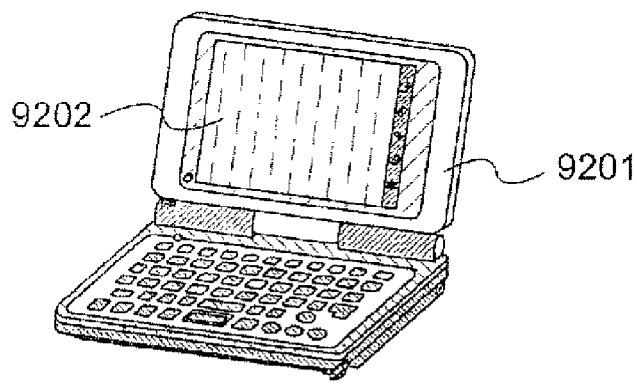
FIGS. 8A to 8E are diagrams showing electronic appliances to which the present invention can be applied.

A portable information terminal device shown in FIG. 8A includes a main body 9201, a display portion 9202, and the like. The semiconductor device of the present invention can be applied to the display portion 9202. As a result, a portable information terminal device which is high-performance and highly reliable can be provided.

Figure 8B:
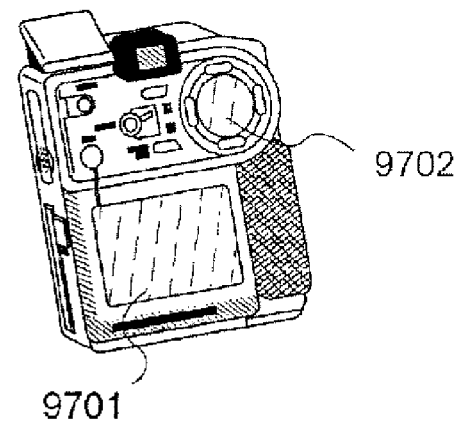

A digital video camera shown in FIG. 8B includes a display portion 9701, a display portion 9702, and the like. The semiconductor device of the present invention can be applied to the display portion 9701. As a result, a digital video camera which is high-performance and highly reliable can be provided.

Figure 8C:
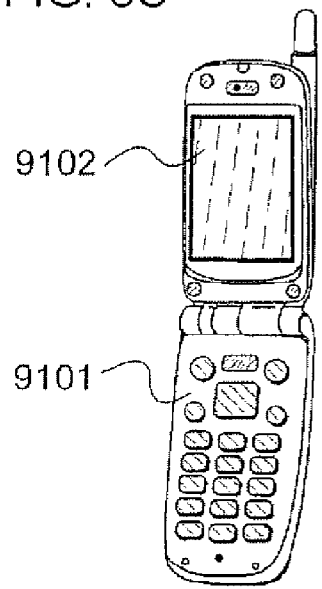

A mobile phone shown in FIG. 8C includes a main body 9101, a display portion 9102, and the like. The semiconductor device of the present invention can be applied to the display portion 9102. As a result, a mobile phone which is high-performance and highly reliable can be provided.

Figure 8D:
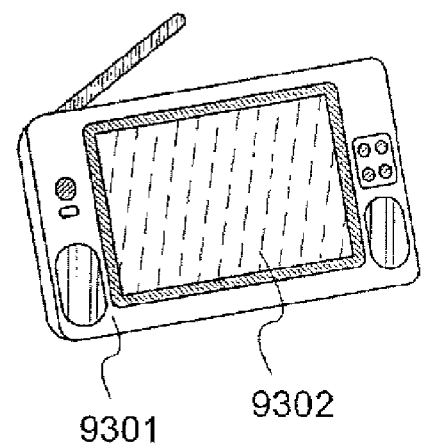

A portable television device shown in FIG. 8D includes a main body 9301, a display portion 9302, and the like. The semiconductor device of the present invention can be applied to the display portion 9302. As a result, a portable television device which is high-performance and highly reliable can be provided. The semiconductor device of the present invention can be applied to a wide range of television devices ranging from a small-sized television device mounted on a portable terminal such as a mobile phone, a medium-sized television device which can be carried, to a large-sized (for example, 40-inch or larger) television device.

Figure 8E:
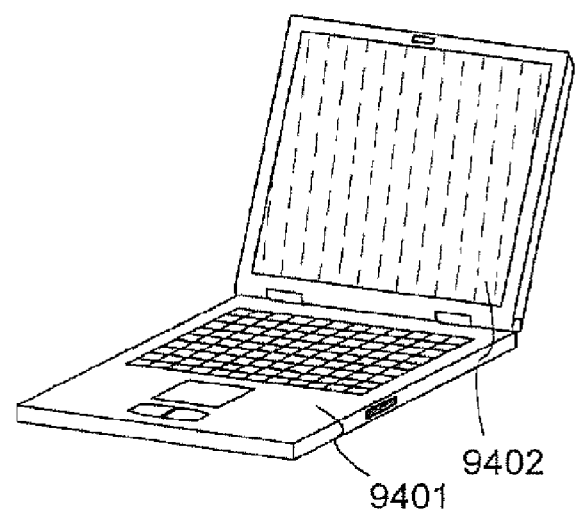

A portable computer shown in FIG. 8E includes a main body 9401, a display portion 9402, and the like. The semiconductor device of the present invention can be applied to the display portion 9402. As a result, a portable computer which is high-performance and highly reliable can be provided.

As described above, an electronic device which is high-performance and highly reliable can be provided by using the semiconductor device of the present invention.

Embodiment Mode 6

A television set can be completed using a semiconductor device including a display element, which is formed by the present invention. An example of a television set which is high-performance and highly reliable will be described.

Figure 15:
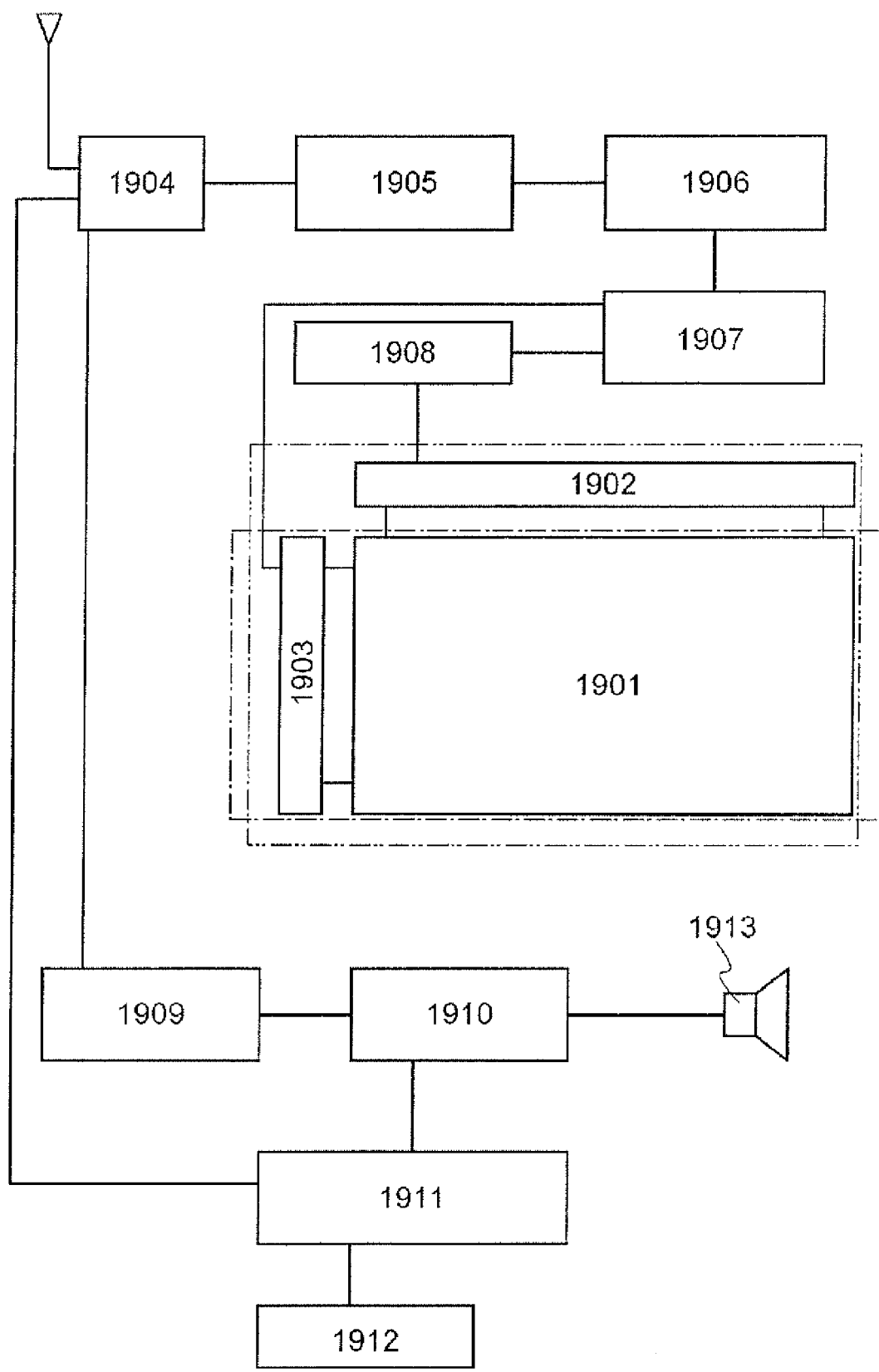
FIG. 15 is a block diagram showing a main structure of an electronic appliance to which the present invention can be applied.

FIG. 15 is a block diagram showing a main structure of a television set (a liquid crystal television set, an EL television set, or the like). A display panel can be formed in any mode as follows: a mode in which a TFT is formed, and a pixel region 1901 and a scan line driver circuit 1903 are formed over a substrate, and a signal line driver circuit 1902 is separately mounted as a driver IC; a mode in which a pixel region 1901, a signal line driver circuit 1902, and a scan line driver circuit 1903 are formed over one substrate; and the like.

As a structure of other external circuits, a video signal amplifier circuit 1905 for amplifying a video signal among signals received by a tuner 1904, a video signal processing circuit 1906 for converting the signals outputted from the video signal amplifier circuit 1905 into chrominance signals corresponding to colors of red, green, and blue respectively, a control circuit 1907 for converting the video signal so as to be inputted to a driver IC, and the like are provided on an input side of the video signal. The control circuit 1907 outputs signals to both a scan line side and a signal line side. In the case of digital driving, a signal dividing circuit 1908 may be provided on the signal line side and an input digital signal may be divided into m pieces to be supplied.

Among signals received by the tuner 1904, an audio signal is transmitted to an audio signal amplifier circuit 1909, and the output thereof is supplied to a speaker 1913 through an audio signal processing circuit 1910. A control circuit 1911 receives control information on a receiving station (receiving frequency) or sound volume from an input portion 1912 and transmits the signal to the tuner 1904 or the audio signal processing circuit 1910.

Figure 16A:
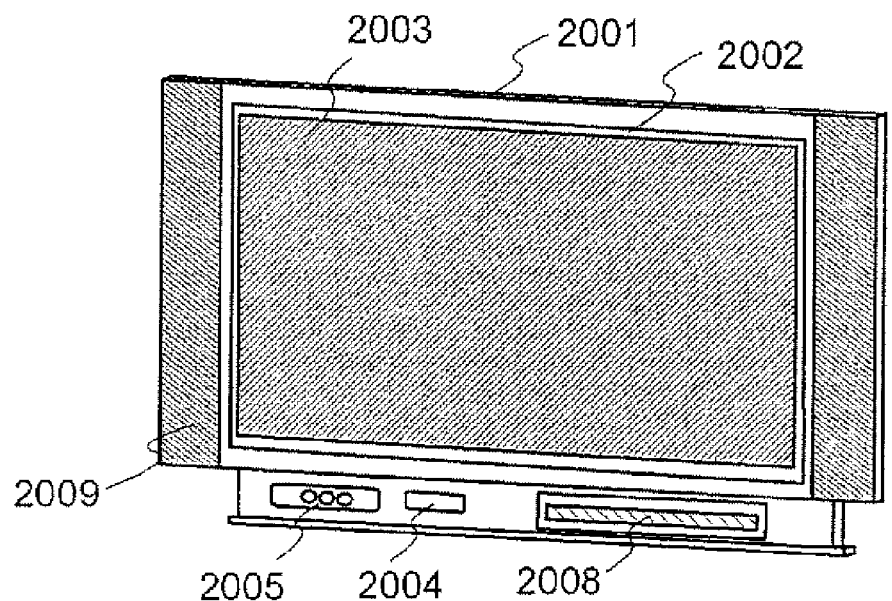
FIGS. 16A and 16B are diagrams showing electronic appliances to which the present invention can be applied.
Figure 16B:
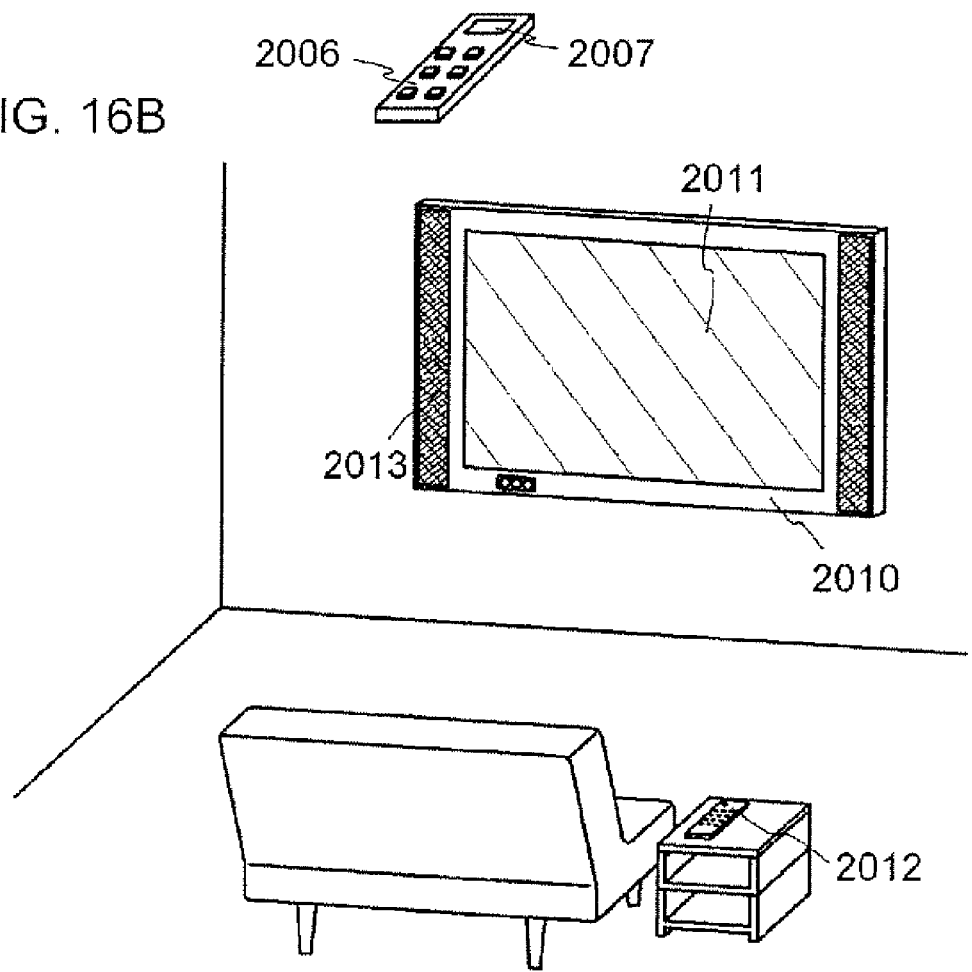

A television set can be completed by incorporating the display module into a chassis as shown in FIGS. 16A and 16B. Such a display panel as shown in FIG. 11, on which an FPC is also mounted, is generally also referred to as a display module. When such an EL display module as shown in FIG. 13 is used, an EL television set can be manufactured. When such a liquid crystal display module as shown in FIG. 12 is used as a display module, a liquid crystal television set can be manufactured. A main screen 2003 is formed using the display module, and a speaker portion 2009, an operation switch, and the like are provided as its accessory equipment. Thus, a television set can be completed by the present invention.

In addition in an EL display module, reflected incident light from external may be blocked with the use of a retardation plate or a polarizing plate. In the case of a top-emission semiconductor device, an insulating layer serving as a partition may be colored to be used as a black matrix. This partition can be formed by a droplet discharging method or the like. Carbon black or the like may be mixed into a black resin of a pigment material or a resin material such as polyimide to be used, and instead, a laminate thereof may be used. By a droplet discharging method, different materials may be discharged to the same region plural times to form the partition. A quarter wave plate or a half wave plate may be used as the retardation plate and may be designed to be able to control light. As the structure, the light-emitting element, the sealing substrate (sealing material), the retardation plates (a quarter wave plate ($\lambda/4$) and a half wave plate ($\lambda/2$)), and the polarizing plate are sequentially formed in this order from the TFT element substrate side, and light emitted from the light-emitting element is transmitted therethrough and is emitted to an external portion from the polarizing plate side. The retardation plate or polarizing plate may be provided on a side to which light is emitted or may be provided on both sides in the case of a dual-emission semiconductor device in which light is emitted from the both sides. In addition, an antireflective film may be provided on the outer side of the polarizing plate. Accordingly, higher-definition and precise images can be displayed.

As shown in FIG. 16A, a display panel 2002 using a display element is incorporated in a chassis 2001. With the use of a receiver 2005, in addition to reception of general TV broadcast, communication of information can also be performed in one way (from a transmitter to a receiver) or in two ways (between a transmitter and a receiver or between receivers) by connection to a wired or wireless communication network through a modem 2004. The television set can be operated by switches incorporated in the chassis or by a remote controller 2006 separated from the main body A display portion 2007 that displays information to be outputted may also be provided in this remote controller.

In addition, in the television set, a structure for displaying a channel, sound volume, or the like may be provided by formation of a subscreen 2008 with a second display panel in addition to the main screen 2003. In this structure, the main screen 2003 may be formed using an EL display panel superior in a viewing angle, and the subscreen 2008 may be formed using a liquid crystal display panel capable of displaying with low power consumption. In order to prioritize low power consumption, a structure in which the main screen 2003 is formed using a liquid crystal display panel, the subscreen 2008 is formed using an EL display panel, and the sub-screen is able to flash on and off may be employed. By the present invention, a display device which is high-performance and highly reliable can be manufactured with high productivity even with the use of such a large substrate, and many TFTs and electronic components.

FIG. 16B shows a television set having a large display portion, for example, 20 to 80-inch display portion, which includes a chassis 2010, a display portion 2011, a remote control device 2012 which is an operation portion, a speaker portion 2013, and the like. The present invention is applied to manufacture of the display portion 2011. The television set shown in FIG. 16B is a wall-hanging type, and does not need a wide space.

By the present invention, a semiconductor device having a display function, which is high-performance and highly reliable, can be manufactured with high productivity. Thus, a television set which is high-performance and highly reliable can be manufactured with high productivity.

It is needless to say that the present invention is not limited to the television set and is also applicable to various uses such as a monitor of a personal computer, or a display medium with a large area, for example, an information display board at a train station, an airport, or the like, or an advertisement display board on the street.

This application is based on Japanese Patent Application serial No. 2007-133382 filed with Japan Patent Office on May 18, 2007, the entire contents of which are hereby incorporated by reference.

What is claimed is:
1. A semiconductor device comprising:
   a first circuit group, a second circuit group, and a third circuit group which are provided over a substrate having an insulating surface;
   the first circuit group including:
      a first transistor including a first single-crystal semiconductor layer and, a first gate insulating layer;

the second circuit group including:
a second transistor including a second single-crystal semiconductor layer, and a second gate insulating layer; and
the third circuit group including:
a third transistor including an amorphous semiconductor layer or a polycrystalline semiconductor layer, and a third gate insulating layer,
wherein each of the first single-crystal semiconductor layer and the second single-crystal semiconductor layer are provided over the substrate with an insulating layer interposed therebetween, and
wherein the first single-crystal semiconductor layer is thinner than the second single-crystal semiconductor layer.

2. The semiconductor device according to claim 1, wherein the first gate insulating layer is thinner than the second gate insulating layer.

3. The semiconductor device according to claim 1,
wherein the first circuit group includes at least one of a data driver, a logic circuit, and a read-only memory circuit of a display device,
wherein the second circuit group includes at least one of a scan driver, a power supply circuit, and a memory circuit which performs electrical writing/rewriting, of the display device, and
wherein the third circuit group includes a pixel portion of the display device.

4. The semiconductor device according to claim 1, wherein the insulating layer provided between a surface of the substrate and the first single-crystal semiconductor layer is thicker than the insulating layer provided between the surface of the substrate and the second single-crystal semiconductor layer.

5. The semiconductor device according to claim 1, further comprising a base film between a surface of the substrate and the first single-crystal semiconductor layer.

6. The semiconductor device according to claim 1, wherein the insulating layer contains silicon oxide formed by a chemical vapor deposition method using an organic silane gas.

7. The semiconductor device according to claim 1, wherein the substrate contains a light-transmitting material.

8. The semiconductor device according to claim 1, wherein the semiconductor device is a portable information terminal, a camera, a phone, a television, a computer, and an IC tag.

9. A semiconductor device comprising:
a first circuit group, a second circuit group, and a third circuit group which are provided over a substrate having an insulating surface;
the first circuit group including a first transistor including a first single-crystal semiconductor layer and, a first gate insulating layer;
the second circuit group including a second transistor including a second single-crystal semiconductor layer which contains a lightly doped drain region, a second gate insulating layer, and a gate electrode; and
the third circuit group including a third transistor including an amorphous semiconductor layer or a polycrystalline semiconductor layer, and a third gate insulating layer,
wherein each of the first single-crystal semiconductor layer and the second single-crystal semiconductor layer are provided over the substrate with an insulating layer interposed therebetween, and
wherein the first single-crystal semiconductor layer is thinner than the second single-crystal semiconductor layer.

10. The semiconductor device according to claim 9, wherein the first gate insulating layer is thinner than the second gate insulating layer.

11. The semiconductor device according to claim 9,
wherein the first circuit group includes at least one of a data driver, a logic circuit, and a read-only memory circuit of a display device,
wherein the second circuit group includes at least one of a scan driver, a power supply circuit, and a memory circuit which performs electrical writing/rewriting, of the display device, and
wherein the third circuit group includes a pixel portion of the display device.

12. The semiconductor device according to claim 9, wherein the insulating layer provided between a surface of the substrate and the first single-crystal semiconductor layer is thicker than the insulating layer provided between the surface of the substrate and the second single-crystal semiconductor layer.

13. The semiconductor device according to claim 9, further comprising a base film between a surface of the substrate and the first single-crystal semiconductor layer.

14. The semiconductor device according to claim 9, wherein the insulating layer contains silicon oxide formed by a chemical vapor deposition method using an organic silane gas.

15. The semiconductor device according to claim 9, wherein the substrate contains a light-transmitting material.

16. The semiconductor device according to claim 9, wherein the semiconductor device is a portable information terminal, a camera, a phone, a television, a computer, and an IC tag.

17. A semiconductor device comprising:
a first circuit group, a second circuit group, and a third circuit group which are provided over a substrate having an insulating surface;
the first circuit group including a first transistor including a first single-crystal semiconductor layer and, a first gate insulating layer;
the second circuit group including a second transistor including a second single-crystal semiconductor layer which contains a lightly doped drain region, a second gate insulating layer, and a gate electrode, wherein the gate electrode does not overlap the lightly doped drain region; and
the third circuit group including a third transistor including an amorphous semiconductor layer or a polycrystalline semiconductor layer, and a third gate insulating layer,
wherein each of the first single-crystal semiconductor layer and the second single-crystal semiconductor layer are provided over the substrate with an insulating layer interposed therebetween, and
wherein the first single-crystal semiconductor layer is thinner than the second single-crystal semiconductor layer.

18. The semiconductor device according to claim 17, wherein the first gate insulating layer is thinner than the second gate insulating layer.

19. The semiconductor device according to claim 17,
wherein the first circuit group includes at least one of a data driver, a logic circuit, and a read-only memory circuit of a display device,
wherein the second circuit group includes at least one of a scan driver, a power supply circuit, and a memory circuit which performs electrical writing/rewriting, of the display device, and
wherein the third circuit group includes a pixel portion of the display device.

20. The semiconductor device according to claim 17, wherein the insulating layer provided between a surface of the substrate and the first single-crystal semiconductor layer is thicker than the insulating layer provided between the surface of the substrate and the second single-crystal semiconductor layer.

21. The semiconductor device according to claim 17, further comprising a base film between a surface of the substrate and the first single-crystal semiconductor layer.

22. The semiconductor device according to claim 17, wherein the insulating layer contains silicon oxide formed by a chemical vapor deposition method using an organic silane gas.

23. The semiconductor device according to claim 17, wherein the substrate contains a light-transmitting material.

24. The semiconductor device according to claim 17, wherein the semiconductor device is a portable information terminal, a camera, a phone, a television, a computer, and an IC tag.

* * * * *

UNITED STATES PATENT AND TRADEMARK OFFICE
CERTIFICATE OF CORRECTION

PATENT NO. : 7,750,345 B2
APPLICATION NO. : 12/055082
DATED : July 6, 2010
INVENTOR(S) : Yoshifumi Tanada It is certified that error appears in the above-identified patent and that said Letters Patent is hereby corrected as shown below:

Column 17, line 63, replace "front" with --from--;

Column 21, line 46, replace "electroliuminescent" with --electroluminescent--;

Column 25, line 46, replace "(CVP)" with --(CMP)--;

Column 25, line 60, replace "the thin" with --then the--.

Signed and Sealed this

Second Day of November, 2010

David J. Kappos
*Director of the United States Patent and Trademark Office*